US010634749B2

(12) United States Patent
Zhang et al.

(10) Patent No.: US 10,634,749 B2
(45) Date of Patent: Apr. 28, 2020

(54) SYSTEM AND METHOD FOR AMPLITUDE REDUCTION IN RF PULSE DESIGN

(71) Applicant: SHANGHAI UNITED IMAGING HEALTHCARE CO., LTD., Shanghai (CN)

(72) Inventors: Gongji Zhang, Shanghai (CN); Renkuan Zhai, Shanghai (CN); Weiguo Zhang, Houston, TX (US); Lingzhi Hu, Shanghai (CN); Chaohong Wang, Shanghai (CN)

(73) Assignee: SHANGHAI UNITED IMAGING HEALTHCARE CO., LTD., Shanghai (CN)

( * ) Notice: Subject to any disclaimer, the term of this patent is extended or adjusted under 35 U.S.C. 154(b) by 225 days.

(21) Appl. No.: 15/692,017

(22) Filed: Aug. 31, 2017

(65) Prior Publication Data

US 2019/0064293 A1 Feb. 28, 2019

(30) Foreign Application Priority Data

Aug. 29, 2017 (CN) .......................... 2017 1 0757761

(51) Int. Cl.
*G01R 33/483* (2006.01)
*G01R 33/54* (2006.01)
(Continued)

(52) U.S. Cl.
CPC ..... *G01R 33/4835* (2013.01); *G01R 33/4833* (2013.01); *G01R 33/543* (2013.01);
(Continued)

(58) Field of Classification Search
CPC .............. G01R 33/4835; G01R 33/543; G01R 33/4833; G01R 33/288; G01R 33/56572
See application file for complete search history.

(56) References Cited

U.S. PATENT DOCUMENTS 7,046,003 B2 * 5/2006 Hargreaves ........ G01R 33/4616
324/307
7,355,404 B1 4/2008 Hariharan et al.
(Continued)

FOREIGN PATENT DOCUMENTS

CN 104598881 A 5/2015

OTHER PUBLICATIONS

Extended European Search Report in European Application No. 17204383.8 dated Jun. 26, 2018, 8 pages.
(Continued)

*Primary Examiner* — Dixomara Vargas
(74) *Attorney, Agent, or Firm* — Metis IP LLC

(57) ABSTRACT

A system and method for modifying RF pulse generated by an MRI system are provided. The method may include: obtaining an excitation variable-rate selective excitation (VERSE) factor and a refocusing VERSE factor; determining a first slice-selection gradient waveform based on an excitation factor and a reference excitation slice-selection gradient waveform; determining a second slice-selection gradient waveform based on a refocusing factor and a reference refocusing slice-selection gradient waveformslice-selection gradient waveformslice-selection gradient waveform; determining an excitation pulse based on the first slice-selection gradient waveform; determining a refocusing pulse based on the second slice-selection gradient waveform, wherein a ratio of the decimal part of the excitation factor to the decimal part of the refocusing factor is equal to a ratio of the amplitude of the first reference waveform to the amplitude of the reference refocusing slice-selection gradient waveform.

20 Claims, 15 Drawing Sheets

(51) Int. Cl.
  *G01R 33/28* (2006.01)
  *G01R 33/565* (2006.01)
(52) U.S. Cl.
  CPC ...... *G01R 33/288* (2013.01); *G01R 33/56527* (2013.01); *G01R 33/56572* (2013.01)

(56) References Cited

U.S. PATENT DOCUMENTS

| | | | |
|---|---|---|---|
| 2006/0061358 A1* | 3/2006 | Hargreaves | ........ G01R 33/4616 324/307 |
| 2010/0207628 A1 | 8/2010 | Hughes et al. | |
| 2016/0131731 A1 | 5/2016 | Oka | |
| 2018/0292489 A1* | 10/2018 | Zeng | .................. G01R 33/4838 |

OTHER PUBLICATIONS

D. Lee et al., VERSE-guided numerical RF pulse design, Proceedings of the iSMRM-ESMRMB Joint Annual Meeting, p. 4924 (2010).

Soustelle L. et al., Minimum-time VERSE pulse correction for slice selectivity improvement in 2D-UTE imaging, Proceedings of The International Society for Magnetic Resonance in Medicine, 24th Annual Meeting & Exhibition, p. 1888 (2016).

Kopanoglu E. et al., Decreasing SAR of a multi-dimensional central brightening inhomogeneity correction pulse using nonlinear gradient fields and VERSE, Proceedings of The International Society for Magnetic Resonance in Medicine, 20th Annual Meeting & Exhibition, p. 3470 (2012).

International Search Report in Application No. PCT/CN2017/114119 dated Apr. 28, 2018, 4 pages.

Written Opinion in International Application No. PCT/CN2017/114119 dated Apr. 28, 2018, 4 pages.

Y. Zur et al. Clinical 3T SAR Reduction Using VERSE Pulses. Proc. Intl. Soc. Mag. Reson. Med. 11, 958 (2003).

Steven Conolly et al. Variable-Rate Selective Excitation. Journal of Magnetic Resonance 78, 440-458 (1988).

Bernstein MA and King KF, Chapter 2—Radiofrequency Pulse Shapes. Handbook of MRI Pulse Sequences, pp. 58-66. 1st Ed. Elsevier Academic Press, USA (2004).

* cited by examiner

110

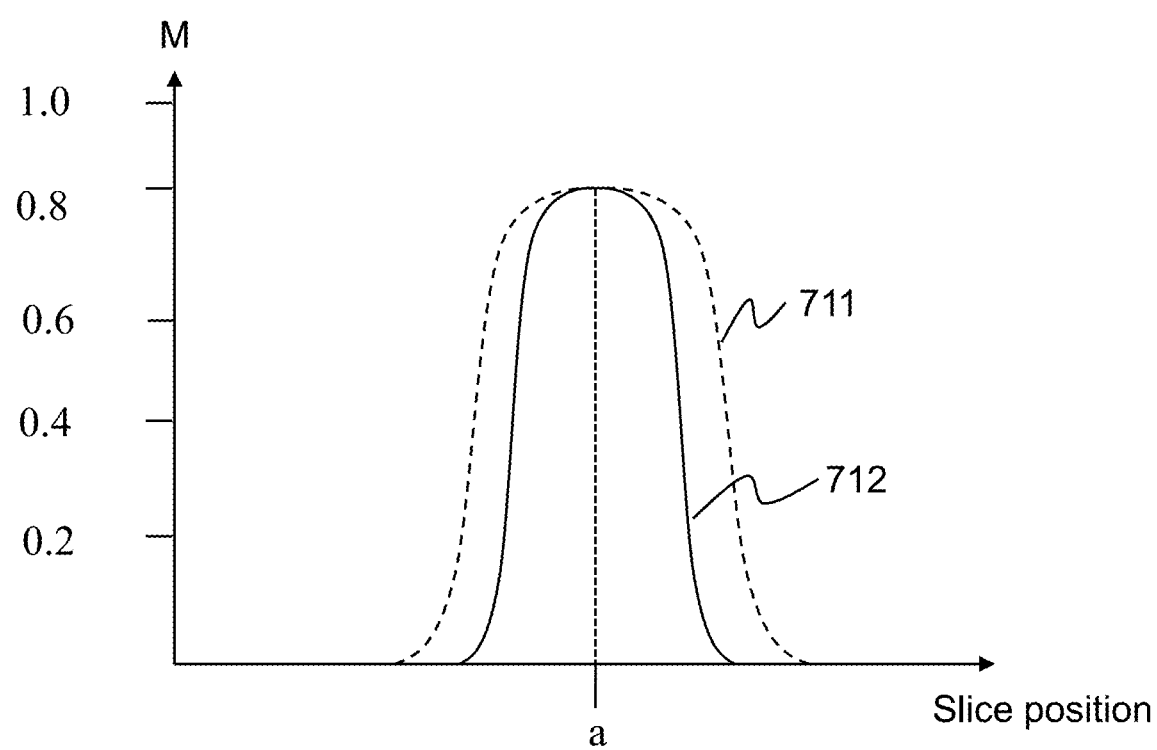
FIG. 7-A

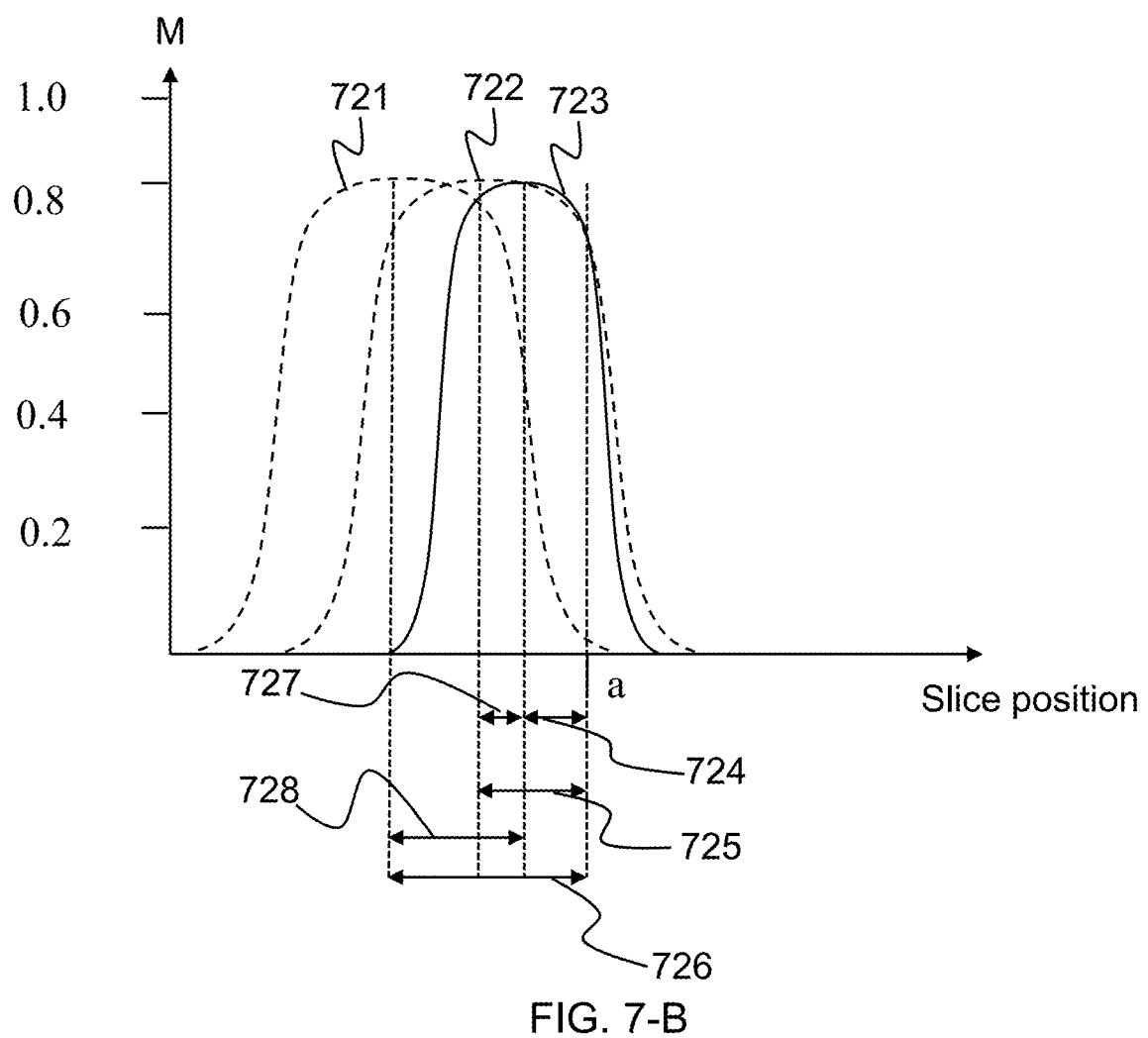
FIG. 7-B

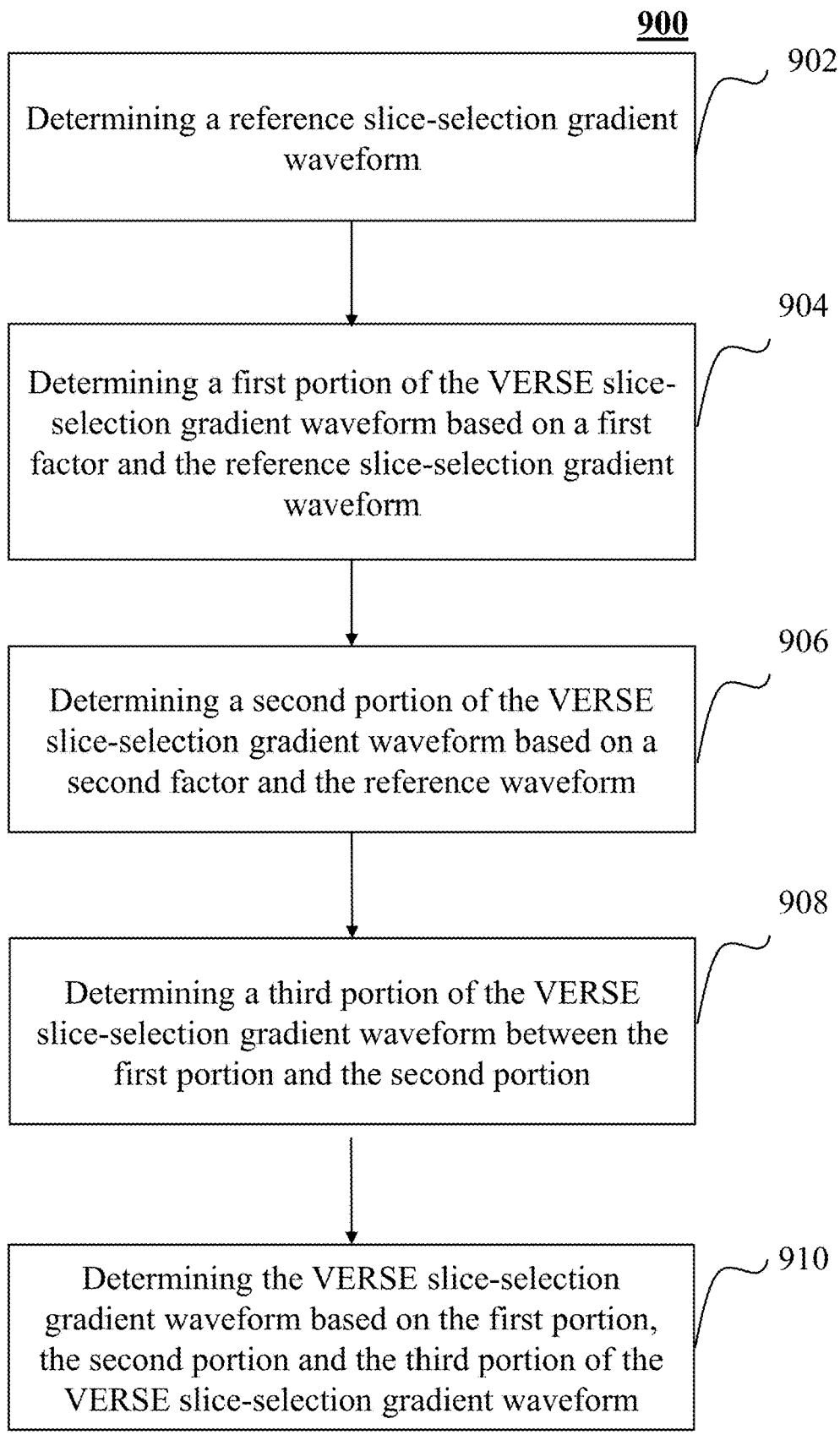
FIG. 9-A

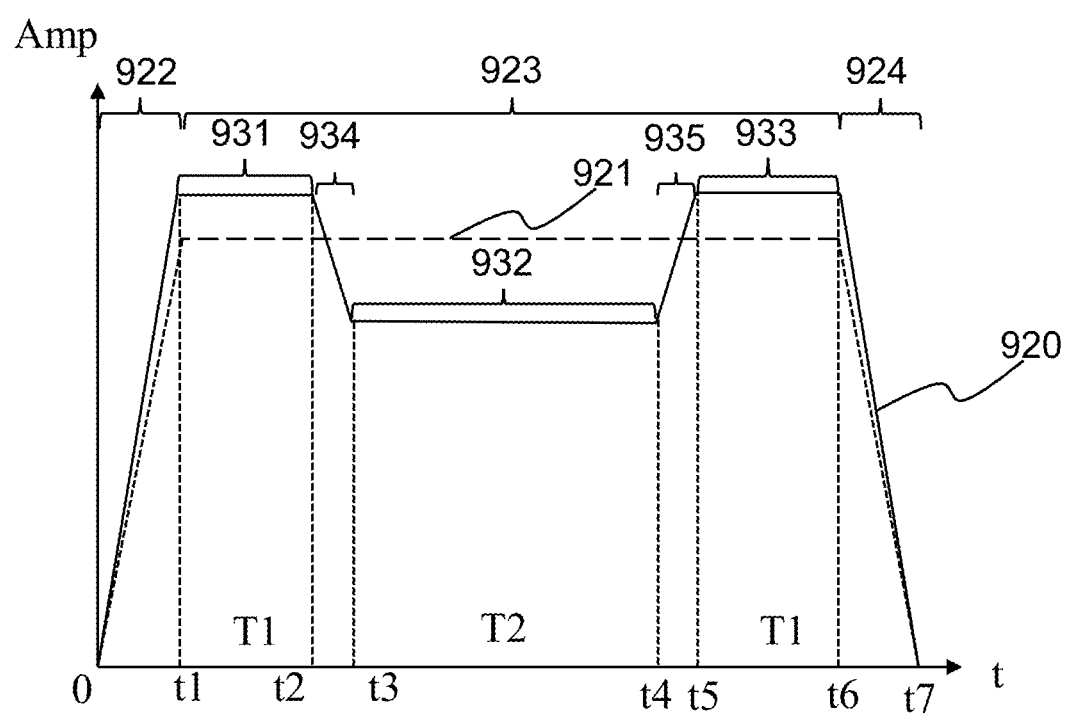
FIG. 9-B

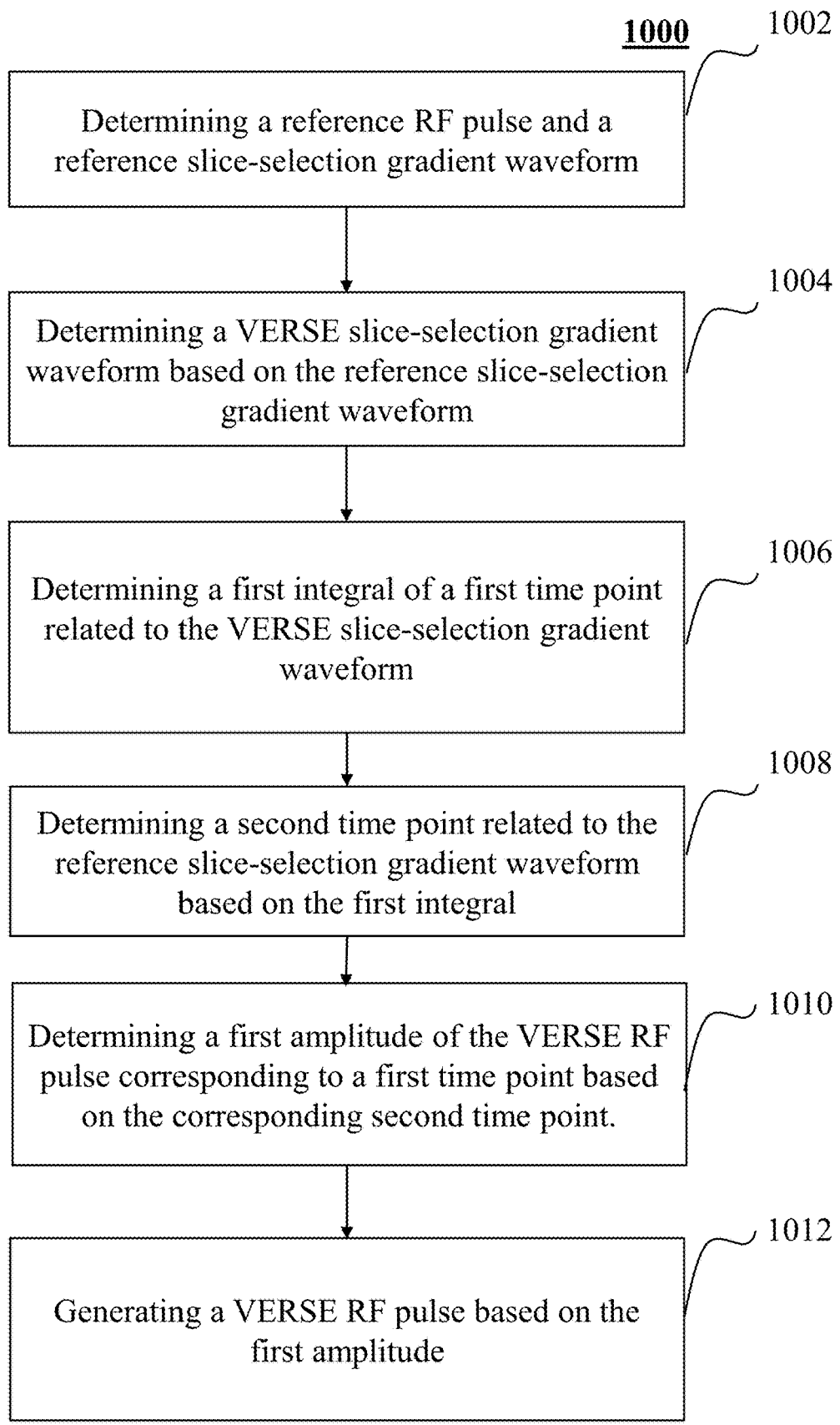
FIG. 10-A

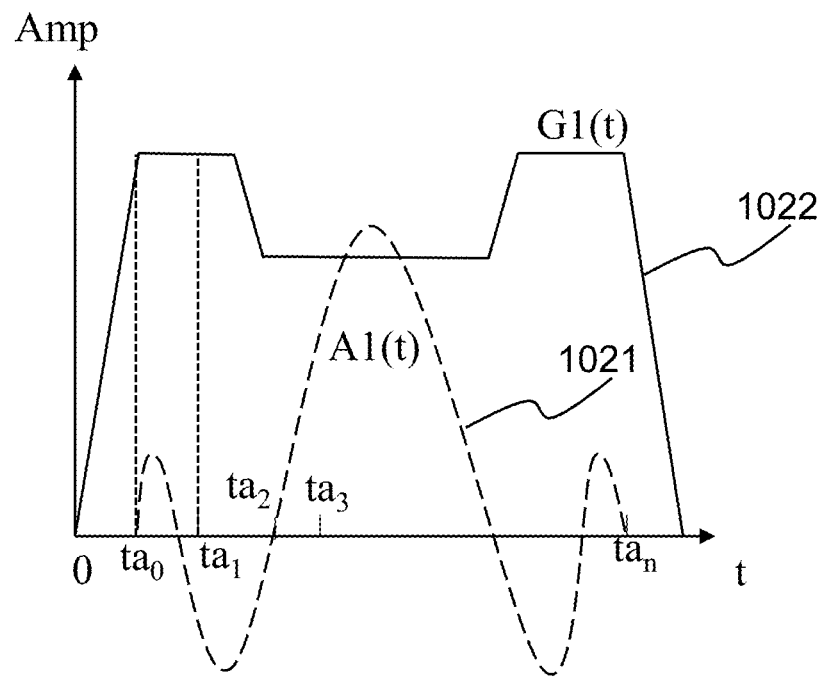
FIG. 10-B
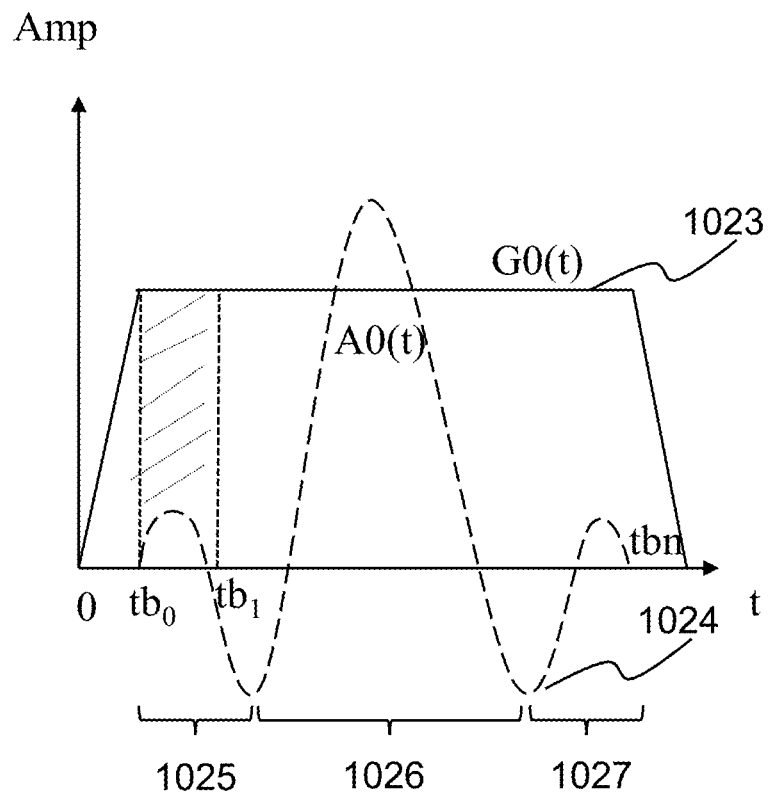
FIG. 10-C

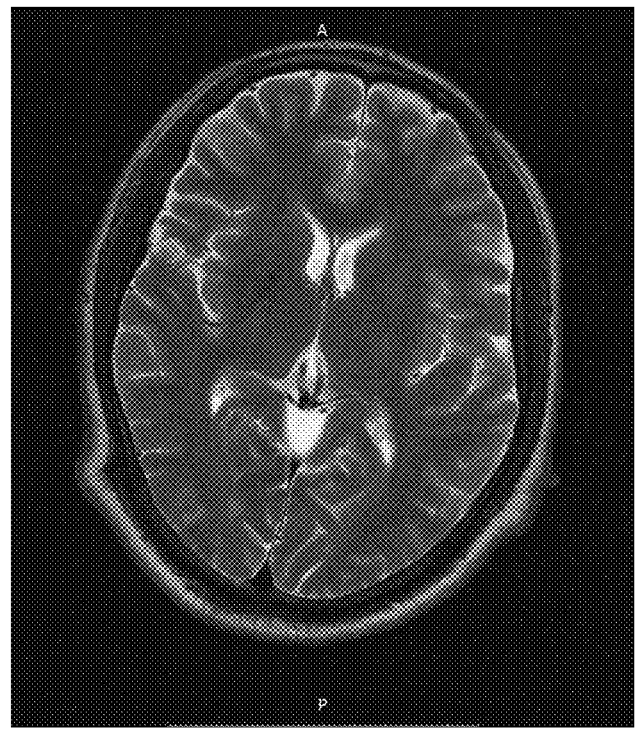
FIG. 11-A
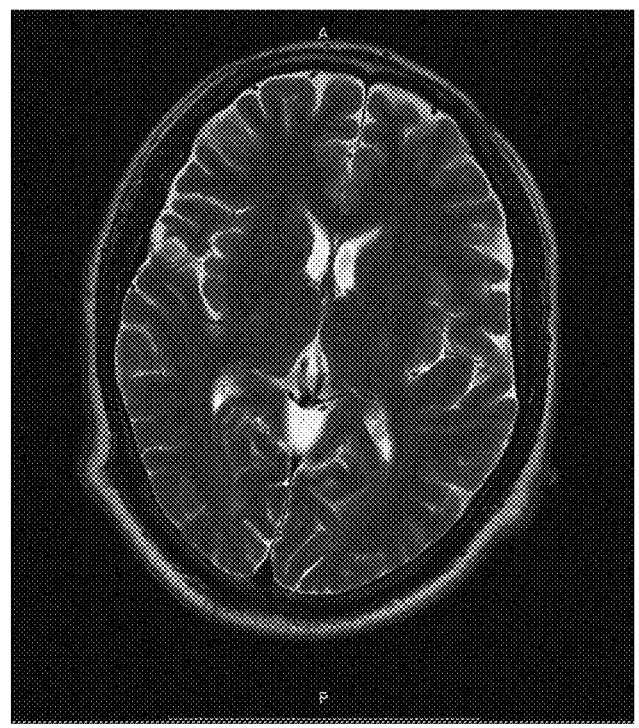
FIG. 11-B

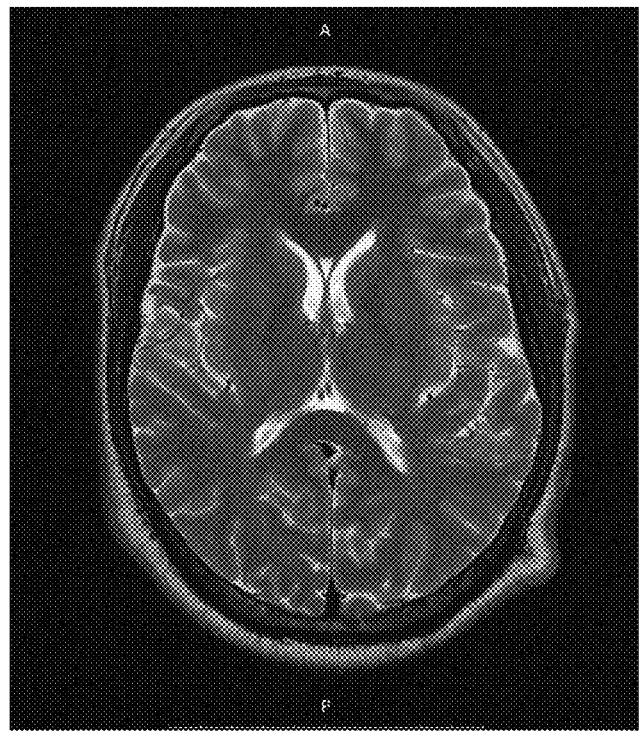
FIG. 12-A
FIG. 12-B

SYSTEM AND METHOD FOR AMPLITUDE REDUCTION IN RF PULSE DESIGN

CROSS REFERENCE

This application claims priority of Chinese Patent Application No. 201710757761.5 filed on Aug. 29, 2017, the entire contents of which are hereby incorporated by reference.

TECHNICAL FIELD

The present disclosure generally relates to magnetic resonance imaging (MRI), and more particularly, a system and method for applying variable-rate selective excitation (VERSE) to MR imaging.

BACKGROUND

The present invention generally relates to magnetic resonance (MR) imaging, and more specifically, to a system and method which provide for RF pulse amplitude reduction in RF pulse design. By a variable-rate selective excitation (VERSE) technique in which the peak or high amplitude portions of an RF pulse and the corresponding gradient waveforms are adjusted, the overall RF transmit power can be reduced, and in turn the specific absorption rate (SAR) of the pulse can be reduced. However, traditional VERSE techniques may reduce the signal noise ratio (SNR) and/or contrast of an MR image due to the off-resonance effect. It may therefore be desirable to have a system and method to improve the SNR and contrast of an MR image while reducing overall RF transmit power.

SUMMARY

In a first aspect of the present disclosure, a method for magnetic resonance imaging is provided. The method may include one or more of the following operations. An excitation variable-rate selective excitation (VERSE) factor and a refocusing VERSE factor may be obtained. A first slice-selection gradient waveform may be generated based on the excitation VERSE factor and a reference excitation slice-selection gradient waveform. A second slice-selection gradient waveform may be generated based on the refocusing VERSE factor and a reference refocusing slice-selection gradient waveform. An amplitude of the first slice-selection gradient waveform and an amplitude of the second slice-selection gradient waveform may be time-varying. An excitation pulse may be generated based on the first slice-selection gradient waveform. A refocusing pulse may be generated based on the second slice-selection gradient waveform. A relationship between the excitation VERSE factor and the refocusing VERSE factor corresponds to a ratio of the amplitude of the reference excitation slice-selection gradient waveform to the amplitude of the reference refocusing slice-selection gradient waveform.

In some embodiments, the excitation VERSE factor or the refocusing VERSE factor is equal to or greater than 1 and less than 2.

In some embodiments, a ratio of the decimal part of the excitation VERSE factor to the decimal part of the refocusing VERSE factor is equal to the ratio of the amplitude of the first reference waveform to the amplitude of the reference refocusing slice-selection gradient waveform.

In some embodiments, to generate a slice-selection gradient waveform, the method may further comprise following operations. A reference gradient waveform may be determined. A first portion of the slice-selection gradient waveform may be generated based on a first factor and the reference gradient waveform. A second portion of the slice-selection gradient waveform may be generated based on a second factor and the reference gradient waveform. A third portion of the slice-selection gradient waveform may be generated based on a ramp between the first portion and the second portion. The slice-selection gradient waveform may be determined based on the first portion, the second portion and the third portion of the slice-selection gradient waveform.

In some embodiments, the first factor may relate to the excitation VERSE factor or the refocusing VERSE factor.

In some embodiments, the first factor may be the excitation VERSE factor or the refocusing VERSE factor.

In some embodiments, the second factor may relate to the excitation VERSE factor or the refocusing VERSE factor.

In some embodiments, a sum of the first factor and the second factor may be a constant.

In some embodiments, the duration of the first portion of the slice-selection gradient waveform equals the duration of the second portion of the slice-selection gradient waveform.

In some embodiments, the first portion of the slice-selection gradient waveform may include a first segment and a second segment.

In some embodiments, the duration of the first segment may equal the duration of the second segment.

In some embodiments, the third portion of the slice-selection gradient waveform may be a linear function or a sine function.

In some embodiments, to generate the excitation pulse or the refocusing pulse, the method may further comprise following operation. A reference pulse may be determined. A first integral related the slice-selection gradient waveform may be determined corresponding to a first time point. A second time point of the reference gradient waveform may be determined based on the first integral. A second integral related to the reference gradient waveform corresponding to the second time point may be equal to the first integral. A second amplitude of the reference pulse may be determined corresponding to the second time point. A first amplitude of an RF pulse corresponding to the first time point may be determined based on the second amplitude. The RF pulse may be generated based on the first amplitude, wherein the RF pulse is the excitation pulse or the refocusing pulse.

In some embodiments, a ratio of the second amplitude of the reference pulse corresponding to the second time point to the first amplitude of the RF pulse corresponding to the first time point may be equal to a ratio of the amplitude of the reference gradient waveform at the second time point to the amplitude of the slice-selection gradient waveform at the first time point.

In some embodiments, the obtaining an excitation VERSE factor and a refocusing VERSE factor may include receiving the refocusing VERSE factor from a user.

In a second aspect of the present disclosure, a system for MRI image reconstruction is provided. The system may include at least one processor and instructions. When the at least one processor executes the instructions, the at least one processor may be directed to perform one or more of the following operations. An excitation variable-rate selective excitation (VERSE) factor and a refocus VERSE factor may be obtained. A first slice-selection gradient waveform may be generated based on an excitation factor. A second slice-selection gradient waveform may be generated based on a refocusing factor. An amplitude of the first slice-selection gradient waveform and amplitude of the second slice-selection gradient waveform may be time-varying. An excitation pulse based on the first slice-selection gradient waveform may be generated. A refocusing pulse may be generated based on the second slice-selection gradient waveform. A relationship between the excitation factor and the refocusing factor corresponds to a ratio of the amplitude of the reference excitation slice-selection gradient waveform to the amplitude of the reference refocusing slice-selection gradient waveform.

In some embodiments, the at least one processor may be further directed to perform one or more of the following operations. A reference gradient waveform may be determined. A first portion of the slice-selection gradient waveform may be generated based on a first factor and the reference gradient waveform. A second portion of the slice-selection gradient waveform may be generated based on a second factor and the reference gradient waveform. A third portion of the slice-selection gradient waveform may be generated based on a ramp between the first portion and the second portion. The slice-selection gradient waveform may be determined based on the first portion, the second portion and the third portion of the slice-selection gradient waveform.

In some embodiments, the at least one processor may be further directed to perform one or more of the following operations. A first integral related the slice-selection gradient waveform may be determined corresponding to a first time point. A second time point of the reference gradient waveform may be determined based on the first integral. A second integral related to the reference gradient waveform corresponding to the second time point may be equal to the first integral. A second amplitude of the reference pulse may be determined corresponding to the second time point. A first amplitude of an RF pulse corresponding to the first time point may be determined based on the second amplitude. The RF pulse may be generated based on the first amplitude, wherein the RF pulse is the excitation pulse or the refocusing pulse.

In some embodiments, a ratio of the second amplitude of the reference pulse corresponding to the second time to the first amplitude of the RF pulse corresponding to the first time may be equal to a ratio of amplitude of the reference gradient waveform at the second time to amplitude of the slice-selection gradient waveform at the first time.

In a third aspect of the present disclosure, a non-transitory computer readable medium is provided. The non-transitory computer readable medium may include executable instructions. When at least one processor executes the instructions, the at least one processor may effectuate a method including one or more of the following operations. An excitation variable-rate selective excitation (VERSE) factor and a refocus VERSE factor may be obtained. A first slice-selection gradient waveform may be generated based on an excitation factor. A second slice-selection gradient waveform may be generated based on a refocusing factor. An amplitude of the first slice-selection gradient waveform and amplitude of the second slice-selection gradient waveform may be time-varying. An excitation pulse based on the first slice-selection gradient waveform may be generated. A refocusing pulse may be generated based on the second slice-selection gradient waveform. A relationship between the excitation factor and the refocusing factor corresponds to a ratio of the amplitude of the reference excitation slice-selection gradient waveform to the amplitude of the reference refocusing slice-selection gradient waveform.

Additional features will be set forth in part in the description which follows, and in part will become apparent to those skilled in the art upon examination of the following and the accompanying drawings or may be learned by production or operation of the examples. The features of the present disclosure may be realized and attained by practice or use of various aspects of the methodologies, instrumentalities and combinations set forth in the detailed examples discussed below.

BRIEF DESCRIPTION OF THE DRAWINGS

The present disclosure is further described in terms of exemplary embodiments. These exemplary embodiments are described in detail with reference to the drawings. These embodiments are non-limiting exemplary embodiments, in which like reference numerals represent similar structures throughout the several views of the drawings, and wherein:

FIG. 7-A illustrates an exemplary relationship between a slice profile of an excitation RF pulse and a slice profile of a refocusing RF pulse for on resonance spins;

FIG. 7-B illustrates an exemplary relationship between a slice profile of an excitation RF pulse and a slice profile of a refocusing RF pulse for off resonance spins;

FIG. 9-A is a flowchart illustrating an exemplary process for generating a VERSE slice-selection gradient waveform according to some embodiments of the present disclosure;

FIG. 9-B is a diagram illustrating exemplary VERSE slice-selection gradient waveforms according to some embodiments of the present disclosure;

FIG. 10-A is a flowchart illustrating an exemplary process for generating the VERSE RF pulse according to some embodiments of the present disclosure;

FIG. 10-B is a diagram illustrating an exemplary VERSE RF pulse according to some embodiments of the present disclosure;

FIG. 10-C is a diagram illustrating an exemplary reference RF pulse according to some embodiments of the present disclosure;

FIG. 11-A is an MR image acquired based on a refocusing RF pulse determined without employing a VERSE technique according to some embodiments of the present disclosure; and, FIG. 11-B is an MR image acquired based on a refocusing RF pulse that is determined using a VERSE technique according to some embodiments of the present disclosure;

FIG. 12-A is an MR image acquired based on a reference RF pulse and reference slice-selection gradient waveform; and FIG. 12-B is an MR image acquired based on a VERSE RF pulse generated from the reference RF pulse illustrated in FIG. 12-A and a VERSE slice-selection gradient waveform generated from the reference slice-selection gradient waveform illustrated in FIG. 12-A.

DETAILED DESCRIPTION

In the following detailed description, numerous specific details are set forth by way of examples in order to provide a thorough understanding of the relevant disclosure. However, it should be apparent to those skilled in the art that the present disclosure may be practiced without such details. In other instances, well-known methods, procedures, systems, components, and/or circuitry have been described at a relatively high-level, without detail, in order to avoid unnecessarily obscuring aspects of the present disclosure. Various modifications to the disclosed embodiments will be readily apparent to those skilled in the art, and the general principles defined herein may be applied to other embodiments and applications without departing from the spirit and scope of the present disclosure. Thus, the present disclosure is not limited to the embodiments shown, but to be accorded the widest scope consistent with the claims.

The terminology used herein is for the purpose of describing particular example embodiments only and is not intended to be limiting. As used herein, the singular forms "a," "an," and "the" may be intended to include the plural forms as well, unless the context clearly indicates otherwise. It will be further understood that the terms "comprise," "comprises," and/or "comprising," "include," "includes," and/or "including," when used in this specification, specify the presence of stated features, integers, steps, operations, elements, and/or components, but do not preclude the presence or addition of one or more other features, integers, steps, operations, elements, components, and/or groups thereof.

It will be understood that the term "system," "engine," "unit," "module," and/or "block" used herein are one method to distinguish different components, elements, parts, section or assembly of different level in ascending order. However, the terms may be displaced by another expression if they achieve the same purpose.

Figure 3:
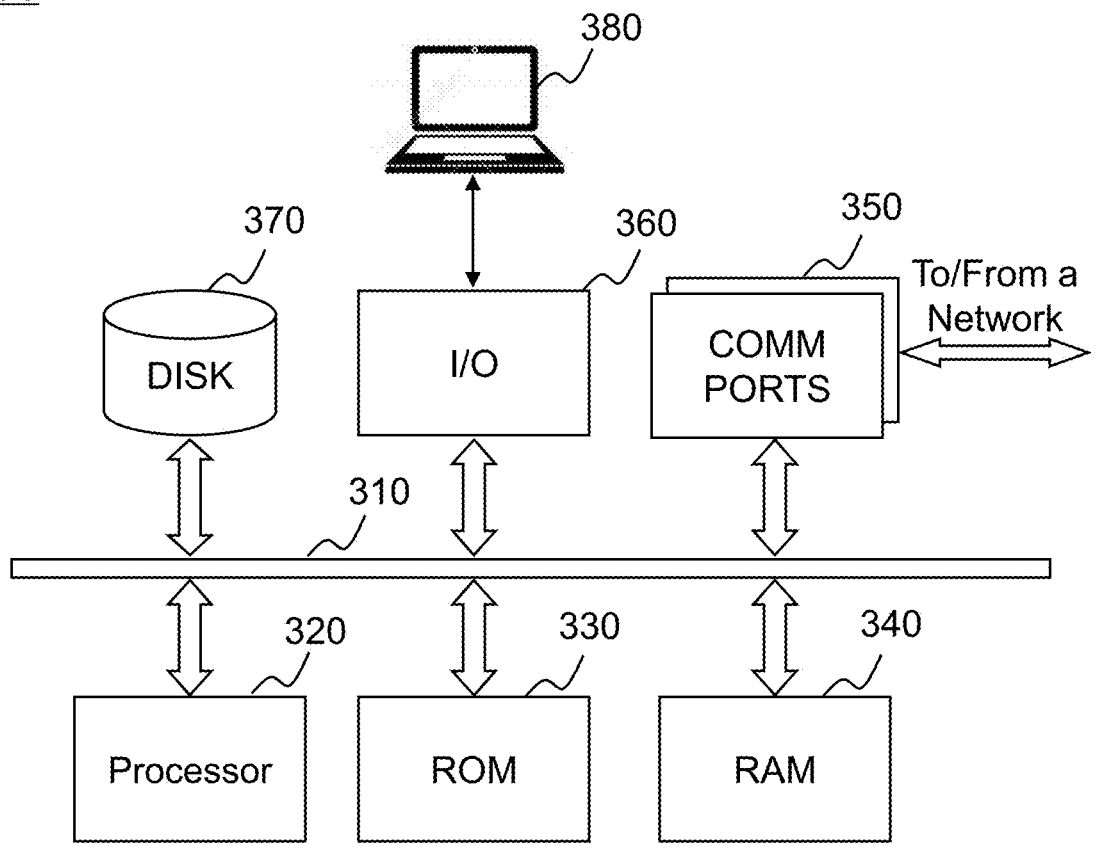
FIG. 3 is a schematic diagram illustrating exemplary hardware and/or software components of an exemplary computing device according to some embodiments of the present disclosure.

Generally, the word "module" or "unit" as used herein, refers to logic embodied in hardware or firmware, or to a collection of software instructions. A module or a unit described herein may be implemented as software and/or hardware and may be stored in any type of non-transitory computer-readable medium or another storage device. In some embodiments, a software module/unit may be compiled and linked into an executable program. It will be appreciated that software modules can be callable from other modules/units or from themselves, and/or may be invoked in response to detected events or interrupts. Software modules/units configured for execution on computing devices (e.g., processor 320 as illustrated in FIG. 3) may be provided on a computer-readable medium, such as a compact disc, a digital video disc, a flash drive, a magnetic disc, or any other tangible medium, or as a digital download (and can be originally stored in a compressed or installable format that needs installation, decompression, or decryption prior to execution). Such software code may be stored, partially or fully, on a storage device of the executing computing device, for execution by the computing device. Software instructions may be embedded in firmware, such as an EPROM. It will be further appreciated that hardware modules/units may be included in connected logic components, such as gates and flip-flops, and/or can be included of programmable units, such as programmable gate arrays or processors. The modules/units or computing device functionality described herein may be implemented as software modules/units, but may be represented in hardware or firmware. In general, the modules/units described herein refer to logical modules/units that may be combined with other modules/units or divided into sub-modules/sub-units despite their physical organization or storage. The description may be applicable to a system, an engine, or a portion thereof.

It will be understood that when a unit, engine, module or block is referred to as being "on," "connected to," or "coupled to," another unit, engine, module, or block, it may be directly on, connected or coupled to, or communicate with the other unit, engine, module, or block, or an intervening unit, engine, module, or block may be present, unless the context clearly indicates otherwise. As used herein, the term "and/or" includes any and all combinations of one or more of the associated listed items.

These and other features, and characteristics of the present disclosure, as well as the methods of operation and functions of the related elements of structure and the combination of parts and economies of manufacture, may become more apparent upon consideration of the following description with reference to the accompanying drawings, all of which form a part of this disclosure. It is to be expressly understood, however, that the drawings are for the purpose of illustration and description only and are not intended to limit the scope of the present disclosure. It is understood that the drawings are not to scale.

In the present disclosure, the term "reference RF pulse" or "RF pulse" may be used interchangeably to refer to a conventionally designed RF pulse based on one or more factors including, for example, a desired flip angle, or a desired duration, or a desired bandwidth, or the like, or any combination thereof. A reference RF pulse may be designed based on one or more a few exemplary design techniques including the Shinnar-LeRoux technique, the small tip angle (STA) approximation, the linear class large tip angle (LCLTA) approximation, a technique based upon the echo-planar imaging (EPI) trajectories, or other determinations based upon the Bloch equations, or the like, or any combination thereof. In some embodiments, a reference RF pulse may have a portion where the amplitude of the reference RF pulse is large such that energy generated by the reference RF pulse doposited in the subject may harm or cause damage to the subject. The term "reference slice-selection gradient waveform" or "slice-selection gradient waveform" in the present disclosure may be used interchangeably to refer to a slice-selection gradient magnetic field pulse designed to be transmitted along with the reference RF pulse. In some embodiments, the reference gradient waveform may be a constant amplitude waveform. As used herein, the reference RF pulse may include an excitation RF pulse and a refocusing RF pulse.

In the present disclosure, the term "VERSE RF pulse" may refer to a reference RF pulse modified by a VERSE technique. According to the VERSE technique, a band width may be expanded with respect to the time while the amplitude of a portion of the reference RF pulse may be reduced where the amplitude is large. Because the SAR per unit weight that is an index of heat generated in an object under MR examination by an RF pulse is proportional to the square of an amplitude, the SAR may be reduced by reducing the maximum amplitude of the reference RF pulse. As used herein, the VERSE RF pulse may include a VERSE excitation RF pulse and a VERSE refocusing RF pulse.

For the technique of VERSE, the off-resonance effect may be a drawback. Because the gradient waveforms are a function of time, and the off-resonance effect may cause a shift of the slice profile boundary at an off-resonance frequency by the amount depending on the gradient amplitude, the off-resonance effect may cause blurring when the VERSE technique is applied. The amplitude of an excitation RF pulse and the amplitude of a refocusing RF pulse may be different, and thus the amplitude of a gradient waveform for the excitation RF pulse and the amplitude of a gradient waveform for the excitation RF pulse may be different. Due to the off-resonance effect, an offset may exist at an off-resonance frequency between a slice profile of the excitation RF pulse and a slice profile of the refocusing RF pulse. If the refocusing RF pulse is modified according to the VERSE technique and the excitation RF pulse is not modified accordingly, or the refocusing RF pulse and/or the excitation RF pulse are improperly modified according to the VERSE technique, the offset may be changed compared to the case without the VERSE modification, and thus signal noise ratio (SNR) and contrast of an MRI image may be reduced. Aspects of the present disclosure relate to systems and methods for reducing specific absorption rate by modifying an excitation RF pulse and/or a corresponding refocusing RF pulse. In some embodiments, the excitation RF pulse may be modified according to a VERSE technique based on an excitation VERSE factor and the refocusing RF pulse may be modified according to the VERSE technique based on a refocusing VERSE factor, such that the offset before the VERSE modification and after the VERSE modification at an off-resonance frequency between a slice profile of the excitation RF pulse and a slice profile of the refocusing RF pulse remain the same.

For illustration purposes, the following description is provided to help better understanding an imaging process. It is understood that this is not intended to limit the scope of the present disclosure. For persons having ordinary skills in the art, a certain amount of variations, changes and/or modifications may be deducted under the guidance of the present disclosure. Those variations, changes and/or modifications do not depart from the scope of the present disclosure.

Figure 1:
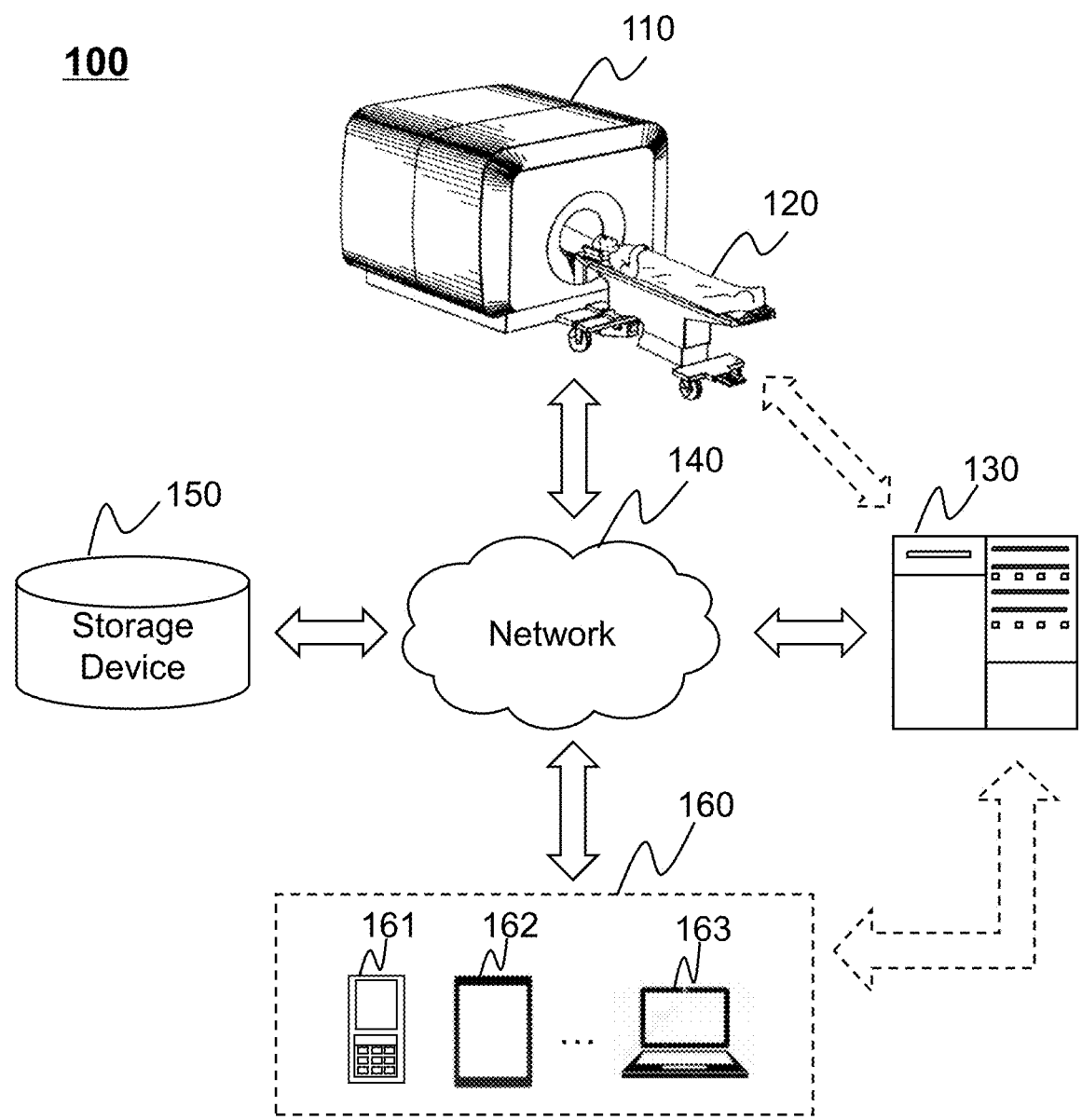
FIG. 1 is a block diagram illustrating an exemplary imaging system according to some embodiments of the present disclosure.

FIG. 1 is a schematic diagram illustrating an exemplary MRI system 100 according to some embodiments of the present disclosure. As shown in FIG. 1, the MRI system 100 may include an MRI scanner 110, an examination table 120, a processing engine 130, a network 140, a storage device 150, and one or more terminals 160.

The MRI scanner 110 may generate or provide imaging data associated with MR signal via scanning a subject, or a part of the subject. In some embodiments, the MRI scanner 110 may include, for example, a magnetic body 220, one or more gradient coils 230, one or more radiofrequency (RF) coils 240, etc., as described in connection with FIG. 2. In some embodiments, the MRI scanner 110 may be a permanent magnet MRI scanner, a superconducting electromagnet MRI scanner, or a resistive electromagnet MRI scanner, etc., according to types of the magnetic body 220. In some embodiments, the MRI scanner 110 may be a high-field MRI scanner, a mid-field MRI scanner, and a low-field MRI scanner, etc., according to the intensity of the magnetic field.

In some embodiments, the MRI scanner 110 may be of a closed-bore (cylindrical) type, an open-bore type, or the like.

In some embodiments, the subject may be placed on the examination table 120 during scanning. The examination table 120 may be sent into the MRI scanner 110 during scanning. In some embodiments, the subject may include a body, a substance, an object, or the like, or any combination thereof. In some embodiments, the subject may include a specific portion of a body, a specific organ, or a specific tissue, such as head, brain, neck, body, shoulder, arm, thorax, cardiac, stomach, blood vessel, soft tissue, knee, feet, or the like, or any combination thereof. In some embodiments, the subject may be a human patient. The human patient may lie on the back, lie in prone, lie on the side on the examination table 120. In some embodiments, the MRI scanner 110 may transmit the imaging data via the network 140 to the processing engine 130, the storage device 150, and/or the terminal 160. For example, the imaging data may be sent to the processing engine 130 for further processing, or may be stored in the storage device 150.

The processing engine 130 may process data and/or information obtained from the MRI scanner 110, the storage device 150, and/or the terminal 160. For example, the processing engine 130 may process imaging data and determine an MRI image based on the imaging data. In some embodiments, the processing engine 130 may be a single server or a server group. The server group may be centralized or distributed. In some embodiments, the processing engine 130 may be local or remote. For example, the processing engine 130 may access information and/or data stored in the MRI scanner 110, the storage device 150, and/or the terminal 160 via the network 140. As another example, the processing engine 130 may be directly connected to the MRI scanner 110, the terminal 160 and/or the storage device 150 to access stored information and/or data. In some embodiments, the processing engine 130 may be implemented on a cloud platform. Merely by way of example, the cloud platform may include a private cloud, a public cloud, a hybrid cloud, a community cloud, a distributed cloud, an inter-cloud, a multi-cloud, or the like, or any combination thereof. In some embodiments, the processing engine 130 may be implemented by a computing device 300 having one or more components as illustrated in FIG. 3.

The network 140 may include any suitable network that can facilitate exchange of information and/or data for the MRI system 100. In some embodiments, one or more components of the MRI system 100 (e.g., the MRI scanner 110, the processing engine 130, the storage device 150, the terminal 160, etc.) may communicate information and/or data with one or more other components of the MRI system 100 via the network 140. For example, the processing engine 130 may obtain imaging data from the MRI scanner 110 via the network 140. As another example, the processing engine 130 may obtain user instructions from the terminal 160 via the network 140. The network 140 may be and/or include a public network (e.g., the Internet), a private network (e.g., a local area network (LAN), a wide area network (WAN), etc.), a wired network (e.g., an Ethernet network), a wireless network (e.g., an 802.11 network, a Wi-Fi network, etc.), a cellular network (e.g., a Long Term Evolution (LTE) network), a frame relay network, a virtual private network ("VPN"), a satellite network, a telephone network, routers, hubs, switches, server computers, or any combination thereof. Merely by way of example, the network 140 may include a cable network, a wireline network, a fiber-optic network, a telecommunications network, an intranet, a wireless local area network (WLAN), a metropolitan area network (MAN), a public telephone switched network (PSTN), a Bluetooth™ network, a ZigBee™ network, a near field communication (NFC) network, or the like, or any combination thereof. In some embodiments, the network 140 may include one or more network access points. For example, the network 140 may include wired and/or wireless network access points such as base stations and/or internet exchange points through which one or more components of the MRI system 100 may be connected to the network 140 to exchange data and/or information.

The storage device 150 may store data, instructions, and/or any other information. In some embodiments, the storage device 150 may store data obtained from the terminal 160 and/or the processing engine 130. In some embodiments, the storage device 150 may store data and/or instructions that the processing engine 130 may execute or use to perform exemplary methods described in the present disclosure. In some embodiments, the storage device 150 may include a mass storage, a removable storage, a volatile read-and-write memory, a read-only memory (ROM), or the like, or any combination thereof. Exemplary mass storage may include a magnetic disk, an optical disk, a solid-state drive, etc. Exemplary removable storage may include a flash drive, a floppy disk, an optical disk, a memory card, a zip disk, a magnetic tape, etc. Exemplary volatile read-and-write memory may include a random access memory (RAM). Exemplary RAM may include a dynamic RAM (DRAM), a double date rate synchronous dynamic RAM (DDR SDRAM), a static RAM (SRAM), a thyristor RAM (T-RAM), and a zero-capacitor RAM (Z-RAM), etc. Exemplary ROM may include a mask ROM (MROM), a programmable ROM (PROM), an erasable programmable ROM (EPROM), an electrically erasable programmable ROM (EEPROM), a compact disk ROM (CD-ROM), and a digital versatile disk ROM, etc. In some embodiments, the storage device 150 may be implemented on a cloud platform. Merely by way of example, the cloud platform may include a private cloud, a public cloud, a hybrid cloud, a community cloud, a distributed cloud, an inter-cloud, a multi-cloud, or the like, or any combination thereof.

In some embodiments, the storage device 150 may be connected to the network 140 to communicate with one or more other components in the MRI system 100 (e.g., the processing engine 130, the terminal 160, etc.). One or more components in the MRI system 100 may access the data or instructions stored in the storage device 150 via the network 140. In some embodiments, the storage device 150 may be directly connected to or communicate with one or more other components in the MRI system 100 (e.g., the processing engine 130, the terminal 160, etc.). In some embodiments, the storage device 150 may be part of the processing engine 130.

The terminal 160 may include a mobile device 161, a tablet computer 162, a laptop computer 163, or the like, or any combination thereof. In some embodiments, the mobile device 161 may include a smart home device, a wearable device, a virtual reality device, an augmented reality device, or the like, or any combination thereof. In some embodiments, the smart home device may include a smart lighting device, a control device of an intelligent electrical apparatus, a smart monitoring device, a smart television, a smart video camera, an interphone, or the like, or any combination thereof. In some embodiments, the wearable device may include a bracelet, a footgear, eyeglasses, a helmet, a watch, clothing, a backpack, a smart accessory, or the like, or any combination thereof. In some embodiments, the mobile device may include a mobile phone, a personal digital assistance (PDA), a gaming device, a navigation device, a point of sale (POS) device, a laptop, a tablet computer, a desktop, or the like, or any combination thereof. In some embodiments, the virtual reality device and/or the augmented reality device may include a virtual reality helmet, virtual reality glasses, a virtual reality patch, an augmented reality helmet, augmented reality glasses, an augmented reality patch, or the like, or any combination thereof. For example, the virtual reality device and/or the augmented reality device may include a Google Glass™, an Oculus Rift™, a Hololens™, a Gear VR™, etc. In some embodiments, the terminal(s) 160 may be part of the processing engine 130.

It should be noted that the above description of the MRI system 100 is merely provided for the purposes of illustration, and not intended to limit the scope of the present disclosure. For persons having ordinary skills in the art, multiple variations and modifications may be made under the teachings of the present disclosure. For example, the assembly and/or function of the MRI system 100 may be varied or changed according to specific implementation scenarios. Merely by way of example, some other components may be added into the MRI system 100, such as a patient positioning unit, a gradient amplifier unit, and other devices or units. Note that the MRI system may be a traditional or a single-modality medical system, or a multi-modality system including, e.g., a positron emission tomography-magnetic resonance imaging (PET-MRI) system, a computed tomography-magnetic resonance imaging (CT-MRI) system, a remote medical MRI system, etc. However, those variations and modifications do not depart from the scope of the present disclosure.

Figure 2:
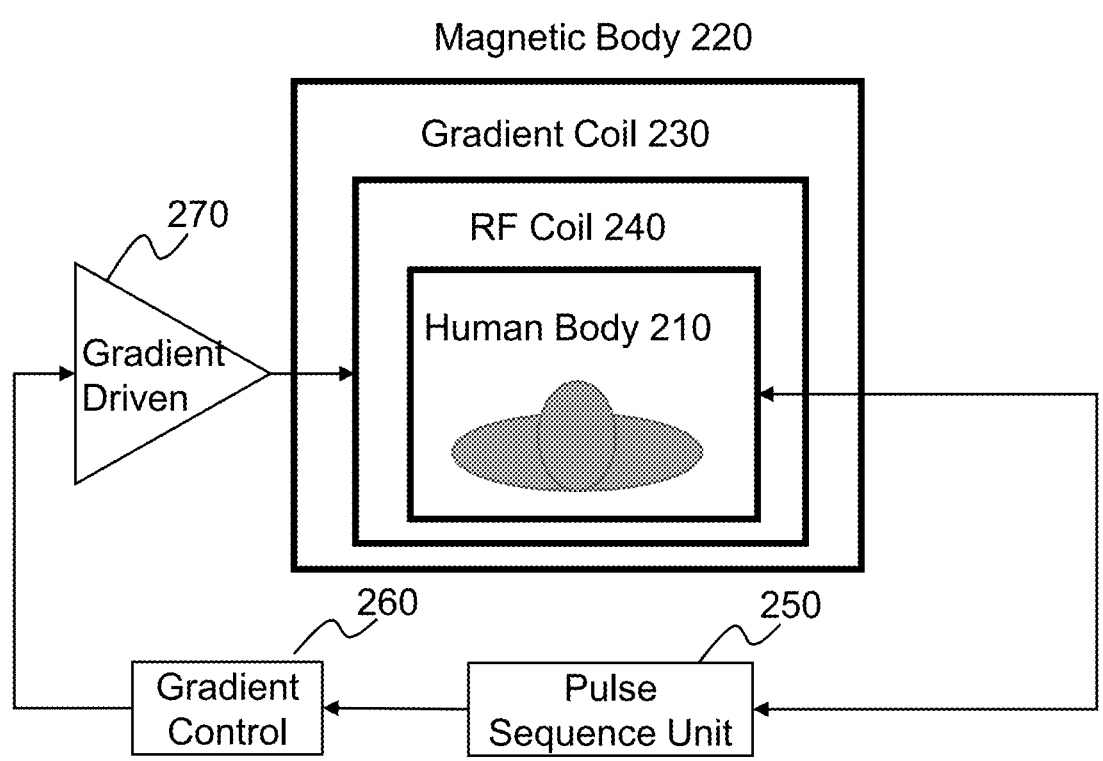
FIG. 2 is a block diagram illustrating an exemplary MR scanner according to some embodiments of the present disclosure.

FIG. 2 is a block diagram illustrating an exemplary MR scanner according to some embodiments of the present disclosure. As shown in the FIG. 2, the MR scanner 110 may include a magnetic body 220, a gradient coil 230, an RF coil 240, a pulse sequence unit 250, a gradient control 260, and a gradient driven 270.

The magnetic body 220 may generate a static main magnetic field B0 during an MRI process. The magnetic body 220 may be of various types including, for example, a permanent magnet, a superconducting electromagnet, a resistive electromagnet, etc.

The gradient coil 230 may generate magnetic field gradients to the main magnetic field B0 in the X, Y, and/or Z directions (or axes). In some embodiments, the gradient coil 230 may include an X-direction (or axis) coil, a Y-direction (or axis) coil, a Z-direction (or axis) coil, etc. For example, the Z-direction coil may be designed based on a circular (Maxwell) coil, while the X-direction coil and the Y-direction coil may be designed on the basis of the saddle (Golay) coil configuration. As used herein, the X direction may also be referred to as the readout (RO) direction (or a frequency encoding direction), the Y direction may also be referred to the phase encoding (PE) direction, the Z direction may also be referred to the slice-selection encoding direction. In the present disclosure, the readout direction and the frequency encoding direction may be used interchangeably.

Merely by way of example, the gradient magnetic fields may include a slice-selection gradient field corresponding to the Z-direction, a phase encoding (PE) gradient field corresponding to the Y-direction, a readout (RO) gradient field corresponding to the X-direction, etc. The gradient magnetic fields in different directions may be used to encode the spatial information of MR signals. In some embodiments, the gradient magnetic fields may also be used to perform at least one function of flow encoding, flow compensation, flow dephasing, or the like, or any combination thereof.

The RF coil 240 may emit RF pulses to and/or receive MR signals from a human body 210 being examined. As used herein, an RF pulse may include an excitation RF pulse and a refocusing RF pulse. In some embodiments, the excitation RF pulse (e.g., a 90-degree RF pulse) may tip magnetization vector away from the direction of the main magnetic field BO. In some embodiments, the refocusing pulse (e.g., a 180-degree RF pulse) may rotate dispersing spin isochromatic about an axis in the transverse plane so that magnetization vector may rephase at a later time. In some embodiments, the RF coil 240 may include an RF transmitting coil and an RF receiving coil. The RF transmitting coil may emit RF pulse signals that may excite the nucleus in the human body 210 to resonate at the Larmor frequency. The RF receiving coil may receive MR signals emitted from the human body 210. In some embodiments, the RF transmitting coil and RF receiving coil may be integrated into one single coil, for example, a transmitting/receiving coil. The RF coil 240 may be one of various types including, for example, a quotient difference (QD) orthogonal coil, a phase-array coil, etc. In some embodiments, different RF coils 240 may be used for the scanning of different parts of a body being examined, for example, a head coil, a knee joint coil, a cervical vertebra coil, a thoracic vertebra coil, a temporomandibular joint (TMJ) coil, etc. In some embodiments, according to its function and/or size, the RF coil 240 may be classified as a volume coil and a local coil. For example, the volume coil may include a birdcage coil, a transverse electromagnetic coil, a surface coil, etc. As another example, the local coil may include a solenoid coil, a saddle coil, a flexible coil, etc.

The pulse sequence unit 250 may determine a pulse sequence. The pulse sequence unit 250 may have several portions including, for example, an RF pulse sub-unit, an ADC sub-unit indicating timing for data acquisition, a group of gradients in x, y, z axes for spatial encoding or selection, or the like, or any combination thereof.

A pulse sequence may be defined by imaging gradient parameters and arrangement in time sequence corresponding to the imaging gradient parameters. In some embodiments, the imaging gradient parameters may include parameters related to an RF pulse emitted by the RF coil 240, the parameters related to gradient fields generated by the gradients coil 230, and the time for collecting MRI data. The different portions of the pulse sequence (e.g., the RF pulse), may refer to different imaging gradient parameters. For example, the parameters related to an RF pulse may include, for example, a bandwidth (also referred to as a frequency range), an amplitude or strength, a time for applying the RF pulse, a duration for applying the RF pulse, etc. The parameters related to the imaging gradient may include an amplitude value of the gradient pulses, a duration of an imaging gradient, a starting time for applying an imaging gradient, an ending time for applying an imaging gradient, etc. The parameters related to the MRI data may include MRI data types, a number of echoes, centers of the echoes, time of echoes, etc.

In some embodiments, the pulse sequence may be a free-induction decay (FID) sequence, a spin echo (SE) sequence, a gradient echo (GRE) sequence, a fast imaging with steady-state precession (FISP) sequence, or the like, or any combination thereof.

In some embodiments, the pulse sequence unit 250 may be connected to and/or communicate with the processing engine 130. For example, before an MRI scanning process, at least one portion of the pulse sequence (e.g., the RF pulse, the imaging gradient) may be designed and/or determined by the processing engine 130 according to clinical demands and/or a scanning protocol. During the MRI scanning process, the RF coil 240 may emit RF pulses with specific parameters related to the RF pulses of the pulse sequence, and receive MR signals. The MR signals may include one portion of the pulse sequence. The gradient control 260 may control the gradient driven 270 to drive the gradient coil 230 by gradient pulses with specific parameters related to the imaging gradient of the pulse sequence. The gradient fields generated by the gradient coil 230 may encode the MR signals. The encoded MR signals may be transmitted to the processing engine 130 for determining an MR image.

This description is intended to be illustrative, and not to limit the scope of the present disclosure. Many alternatives, modifications, and variations will be apparent to those skilled in the art. The features, structures, methods, and characteristics of the exemplary embodiments described herein may be combined in various ways to obtain additional and/or alternative exemplary embodiments. For example, the MR scanner 110 may include an output channel and/or an input channel for sending and receiving information (e.g., information relating to an RF pulse, an imaging gradient, etc.). However, those variations and modifications do not depart the scope of the present disclosure.

FIG. 3 is a schematic diagram illustrating exemplary hardware and/or software components of an exemplary computing device on which the processing engine 130 may be implemented according to some embodiments of the present disclosure. The processing engine 130 may be implemented on the computing device via its hardware, software program, firmware, or any combination thereof. Although only one such computing device is shown, for convenience, the functions of the processing engine 130 described in the present disclosure may be implemented in a distributed fashion on a number of similar platforms, to distribute the processing load. The processing engine 130 may include, among other things, an internal communication bus 310, a processor 320, a program storage and data storage of different forms (e.g., a disk 370, a read only memory (ROM) 330, or a random access memory (RAM) 340), for various data files to be processed and/or communicated by the computer, as well as possibly program instructions to be executed by processor 320. Aspects of the methods of the image processing and/or other processes, as outlined herein, may be embodied in programming. Program aspects of the technology may be thought of as "products" or "articles of manufacture" typically in the form of executable code and/or associated data that is carried on or embodied in a type of machine readable medium. Tangible non-transitory "storage" type media may include any or all of the memory or other storage for the computers, processors, or the like, or associated modules thereof, such as various semiconductor memories, tape drives, disk drives and the like, which may provide storage at any time for the software programming.

All or portions of the software may at times be communicated through a network such as the Internet or various other telecommunication networks. Such communications, for example, may enable loading of the software from one computer or processor into another, for example, from a management server or host computer of a mammography system into the hardware platform(s) of a computing environment or other system implementing a computing environment or similar functionalities in connection with the image processing. Thus, another type of media that may bear the software elements includes optical, electrical, and electromagnetic waves, such as used across physical interfaces between local devices, through wired and optical landline networks and over various air-links. The physical elements that carry such waves, such as wired or wireless links, optical links or the like, also may be considered as media bearing the software. As used herein, unless restricted to tangible "storage" media, terms such as computer or machine "readable medium" refer to any medium that participates in providing instructions to a processor for execution.

A computer-readable medium may take many forms including, for example, a tangible storage medium, a carrier wave medium, or physical transmission medium. Non-volatile storage media include, for example, optical or magnetic disks, such as any of the storage devices in any computer(s) or the like, which may be used to implement the system or any of its components as shown in the drawings. Volatile storage media may include dynamic memory, such as a main memory of such a computer platform. Tangible transmission media may include coaxial cables; copper wire and fiber optics, including the wires that form a bus within a computer system. Carrier-wave transmission media may take the form of electric or electromagnetic signal, or acoustic or light waves such as those generated during radio frequency (RF) and infrared (IR) data communications. Common forms of computer-readable media therefore may include for example: a floppy disk, a flexible disk, a hard disk, a magnetic tape, any other magnetic medium, a CD-ROM, a DVD or DVD-ROM, any other optical medium, punch cards paper tape, any other physical storage medium with patterns of holes, a RAM, a PROM or an EPROM, a FLASH-EPROM, any other memory chip or cartridge, a carrier wave transporting data or instructions, cables or links transporting such a carrier wave, or any other medium from which a computer may read programming code and/or data. Many of these forms of computer readable media may be involved in carrying one or more sequences of one or more instructions to a physical processor for execution.

The processor 320 may execute program instructions stored in a storage device (e.g., disk 370, ROM 330, RAM 340) to perform one or more functions of the processing engine 130 described in the present disclosure. The processor 320 may include a central processing unit (CPU), an application-specific integrated circuit (ASIC), an application-specific instruction-set processor (ASIP), a graphics processing unit (GPU), a physics processing unit (PPU), a digital signal processor (DSP), a field programmable gate array (FPGA), a programmable logic device (PLD), a microcontroller unit, an advanced RISC machines processor (ARM), or the like, or a combination thereof.

The I/O 360 may input and/or output signals, data, information, etc. In some embodiments, the I/O 360 may enable a user interaction with the processing engine 130. In some embodiments, the I/O 360 may include an input device and an output device. Examples of the input device may include a keyboard, a mouse, a touch screen, a microphone, or the like, or any combination thereof. Examples of the output device may include a display device, a loudspeaker, a printer, a projector, or the like, or any combination thereof. Examples of the display device may include a liquid crystal display (LCD), a light-emitting diode (LED)-based display, a flat panel display, a curved screen, a television device, a cathode ray tube (CRT), a touch screen, or the like, or any combination thereof.

The communication port 350 may be connected to a network (e.g., the network 140) to facilitate data communications. The communication port 350 may establish connections between the MR scanner 110, the examination table 120, the processing engine 130, the terminal device 160, and/or the storage device 150. The connection may be a wired connection, a wireless connection, any other communication connection that can enable data transmission and/or reception, or any combination of these connections. The wired connection may include, for example, an electrical cable, an optical cable, a telephone wire, or the like, or any combination thereof. The wireless connection may include, for example, a Bluetooth™ link, a Wi-Fi™ link, a WiMax™ link, a WLAN link, a ZigBee link, a mobile network link (e.g., 3G, 4G, 5G, etc.), or the like, or any combination thereof. In some embodiments, the communication port 350 may be and/or include a standardized communication port, such as RS232, RS485, etc. In some embodiments, the communication port 350 may be a specially designed communication port. For example, the communication port 350 may be designed in accordance with the digital imaging and communications in medicine (DICOM) protocol.

Those skilled in the art will recognize that the present teachings are amenable to a variety of modifications and/or enhancements. For example, although the implementation of various components described herein may be embodied in a hardware device, it may also be implemented as a software only solution, for example, an installation on an existing server. In addition, the processing engine 130 as disclosed herein may be implemented as firmware, firmware/software combination, firmware/hardware combination, or a hardware/firmware/software combination.

Figure 4:
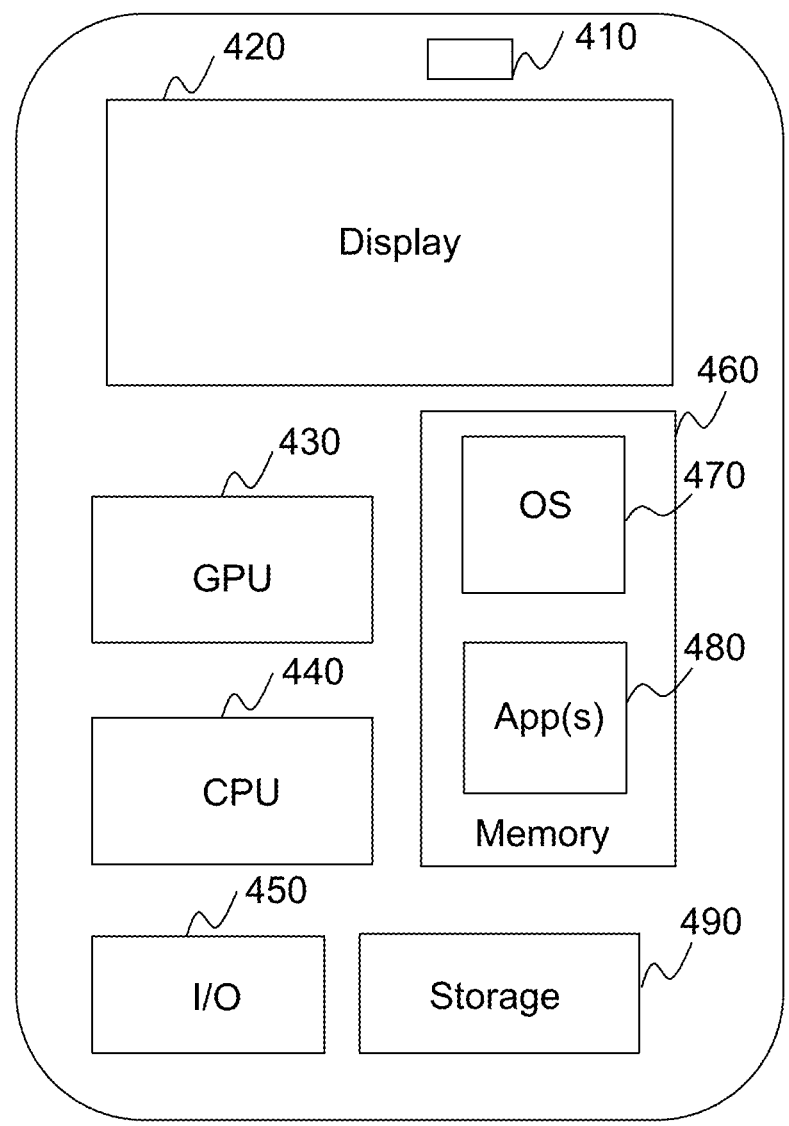
FIG. 4 is a schematic diagram illustrating exemplary hardware and/or software components of an exemplary mobile device on which a user terminal may be implemented according to some embodiments of the present disclosure.

FIG. 4 is a schematic diagram illustrating exemplary hardware and/or software components of an exemplary mobile device on which the terminal device 160 may be implemented according to some embodiments of the present disclosure. As illustrated in FIG. 4, the mobile device 400 may include a communication platform 410, a display 420, a graphic processing unit (GPU) 430, a central processing unit (CPU) 440, an I/O 450, a memory 460, and storage 490. In some embodiments, any other suitable component, including but not limited to a system bus or a controller (not shown), may also be included in the mobile device 400. In some embodiments, a mobile operating system 470 (e.g., iOS™, Android™, Windows Phone™, etc.) and one or more applications 480 may be loaded into the memory 460 from the storage 490 in order to be executed by the CPU 440. The applications 480 may include a browser or any other suitable mobile apps for receiving and rendering information respect to data processing or other information from the processing engine 130. User interactions with the information stream may be achieved via the I/O 450 and provided to the processing engine 130 and/or other components of the imaging system 100 via the network 140.

To implement various modules, units, and their functionalities described in the present disclosure, computer hardware platforms may be used as the hardware platform(s) for one or more of the elements described herein. A computer with user interface elements may be used to implement a personal computer (PC) or any other type of work station or external device. A computer may also act as a server if appropriately programmed.

Figure 5:
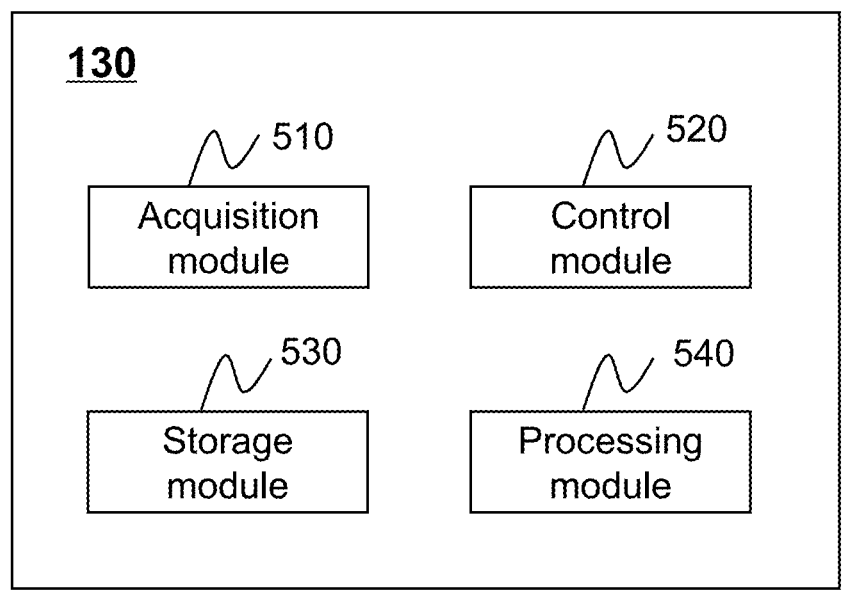
FIG. 5 is a block diagram illustrating an exemplary processing engine according to some embodiments of the present disclosure.

FIG. 5 is a block diagram illustrating an exemplary processing engine according to some embodiments of the present disclosure. The processing engine 130 may include an acquisition module 510, a control module 520, a storage module 530, and a processing module 540. In some embodiments, the acquisition module 510, the control module 520, the storage module 530, and/or the processing module 540 may be connected to and/or communicate with each other via a wired connection, a wireless connection, or any combination thereof.

The acquisition module 510 may acquire data. In some embodiments, the data may be acquired from the MR scanner 110, the examination table 120, the storage device 150, and/or the terminal device 160. In some embodiments, the data may include a scanning protocol, at least one portion of imaging gradient parameters as described elsewhere in the present disclosure, image data (e.g., encoded MR signals), instructions, or the like, or any combination thereof. The instructions may be executed by the processor(s) of the processing engine 130 to perform exemplary methods described in the present disclosure. In some embodiments, the acquired data may be transmitted the processing module 540 for further processing, or stored in the storage module 530.

In some embodiments, the acquisition module 510 may obtain data inputted by a user. For example, the acquisition module 510 may obtain a refocusing VERSE factor inputted by a user via an I/O 360, and the processing module 540 may determine an excitation VERSE factor based on the refocusing VERSE factor. As another example, the acquisition module 510 may obtain an excitation VERSE factor inputted by the user via the I/O 360, and the processing module 540 may determine a refocusing VERSE factor based on the excitation VERSE factor.

The control module 520 may control operations of the acquisition module 510, the examination table 120, the storage module 530, and/or the processing module 540 (e.g., by generating one or more control parameters). For example, the control module 520 may control the acquisition module 510 to acquire data. As another example, the control module 520 may control the movement of the examination table 120. As still another example, the control module 520 may control the processing module 540 to process a scanning protocol for determining one or more imaging gradient parameters. In some embodiments, the control module 520 may receive a real-time command or retrieve a predetermined command provided by a user (e.g., a doctor) to control one or more operations of the acquisition module 510 and/or the processing module 540. For example, the control module 520 may adjust the acquisition module 510 and/or the processing module 540 to generate image data based on the MR signals according to the real-time command and/or the predetermined command. In some embodiments, the control module 520 may communicate with one or more other modules of the processing engine 130 for exchanging information and/or data.

The storage module 530 may store imaging gradient parameters, processed data, instructions, or the like, or any combination thereof. In some embodiments, the storage module 530 may store one or more scanning protocols, a portion of imaging gradient parameters and/or encoded MR signals. In some embodiments, the storage module 530 may store program(s) and/or instruction(s) that can be executed by the processor(s) of the processing engine 130 to acquire data, determine imaging gradient parameters, reconstruct an image based on the imaging gradient parameters, and/or display any intermediate result or a resultant image.

The processing module 540 may process data provided by various modules of the processing engine 130. In some embodiments, the processing module 540 may process MR signals for reconstructing an MR image acquired by the acquisition module 510, retrieved from the storage module 530 and/or the storage device 150, etc.

In some embodiments, one or more modules illustrated in FIG. 5 may be implemented in at least part of the exemplary imaging system 100 as illustrated in FIG. 1. For example, the acquisition module 510, the control module 520, the storage module 530, and/or the processing module 540 may be integrated into a console (not shown). Via the console, a user may set parameters for scanning a subject, controlling an imaging process, controlling parameters for reconstruction of an image, view information (e.g., an image, data, a message) relating to the subject, etc. In some embodiments, at least part of the console may be implemented on or communicate with the processing engine 130 and/or the terminal device 160.

Figure 6:
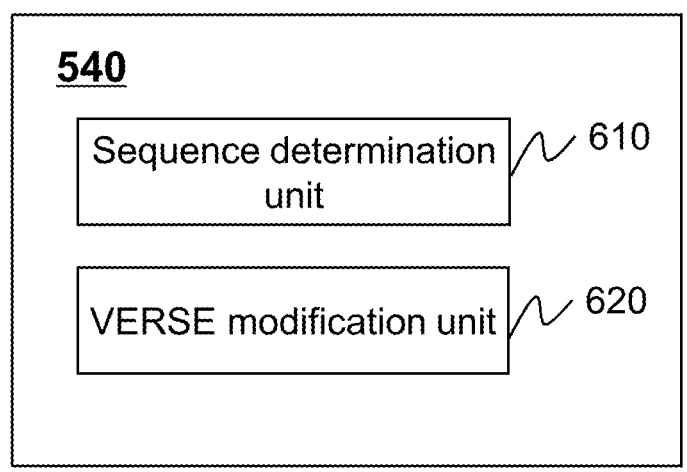
FIG. 6 is a block diagram illustrating an exemplary processing module according to some embodiments of the present disclosure.

FIG. 6 is a block diagram illustrating an exemplary processing module according to some embodiments of the present disclosure. As shown, the processing module 540 may include a sequence determination unit 610 and a VERSE modification unit 620. In some embodiments, the sequence determination unit 610 and the VERSE modification unit 620 may be connected to and/or communicate with each other via a wired connection, a wireless connection, or any combination thereof.

The sequence determination unit 610 may be configured to determine a reference RF pulse and a reference slice-selection gradient waveform. The reference RF pulse may be determined by the sequence determination unit 610. The reference RF pulse may include an excitation reference RF pulse and a refocusing reference RF pulse. The reference RF pulse may be determined by one or more of a few exemplary techniques including the Shinnar-LeRoux technique, the small tip angle (STA) approximation, the linear class large tip angle (LCLTA) approximation, a technique based upon EPI trajectories, a technique based upon the Bloch equations, or the like, or any combination thereof. The reference gradient waveform may be a waveform of a constant amplitude transmitted along with the reference RF pulse. The sequence determination unit 610 may determine the reference RF pulse and the reference slice-selection gradient waveform based on gradient parameters, such as a desired flip angle, or a desired duration, or a desired bandwidth, or the like, or any combination thereof.

The VERSE modification unit 620 may be configured to determine a VERSE RF pulse and a VERSE slice-selection gradient waveform. The VERSE modification unit 620 may modify the reference RF pulse and the reference slice-selection gradient waveform based on a VERSE factor. The VERSE factor may include an excitation VERSE factor (for modifying the excitation slice-selection gradient waveform) and a refocusing VERSE factor (for modifying the refocusing slice-selection gradient waveform). The VERSE factor may reflect a relationship between the amplitude of a slice-selection gradient waveform before the slice-selection gradient waveform is modified by a VERSE technique and the amplitude of a slice-selection gradient waveform after the slice-selection gradient waveform is modified according to the VERSE technique. In some embodiments, taking the amplitude of a slice-selection gradient waveform before the VERSE modification as G1 (e.g., 921 in FIG. 9-B) and the amplitude of some portion of the slice-selection gradient waveform compressed according to the VERSE technique as G2 (e.g., 932 in FIG. 9-B), the VERSE factor $\lambda$ is a value between 1 and 2 that may be expressed as $\lambda=2-G2/G1$. That is, the larger the VERSE factor $\lambda$ becomes, the more the amplitude of a slice-selection gradient waveform is reduced according to the VERSE modification.

In some embodiments, the acquisition module 510 may obtain a refocusing VERSE factor inputted by a user via an I/O 360, and the VERSE modification unit 620 may determine an excitation VERSE factor based on the refocusing VERSE factor and a relationship between the excitation VERSE factor and the refocusing VERSE factor. As another example, the acquisition module 510 may obtain an excitation VERSE factor inputted by the user via the I/O 360, and the VERSE modification unit 620 may determine a refocusing VERSE factor based on the excitation VERSE factor and a relationship between the excitation VERSE factor and the refocusing VERSE factor. In some embodiments, the relationship between the excitation VERSE factor and the refocusing VERSE factor may be expressed below:

$$\frac{\lambda_{exc} - 1}{\lambda_{refoc} - 1} = \frac{Gss_{exc}}{Gss_{refoc}}. \quad (1)$$

$\lambda_{exc}$ may denote the excitation VERSE factor. $\lambda_{refoc}$ may denote the refocusing VERSE factor. $Gss_{exc}$ may denote the amplitude of the reference excitation slice-selection gradient waveform. $Gss_{refoc}$ may denote the amplitude of the reference refocusing slice-selection gradient waveform.

This description is intended to be illustrative, and not to limit the scope of the present disclosure. Many alternatives, modifications, and variations will be apparent to those skilled in the art. The features, structures, methods, and characteristics of the exemplary embodiments described herein may be combined in various ways to obtain additional and/or alternative exemplary embodiments. For example, the sequence determination unit 610 and the VERSE modification unit 620 may be integrated into one single unit. However, those variations and modifications do not depart the scope of the present disclosure.

FIG. 7-A and FIG. 7-B are diagrams illustrating exemplary relationships between a slice profile of an excitation RF pulse and a slice profile of a refocusing RF pulse for on resonance spins and off resonance spins. The term "slice profile" as used in the present disclosure may refer to a distribution of transverse magnetization produced by an RF pulse. In FIG. 7-A and FIG. 7-B, the horizontal ordinate represents slice position and the vertical ordinate represents transverse magnetization strength.

As shown in FIG. 7-A, a slice profile 712 may be generated by an excitation RF pulse for on resonance spins and a slice profile 711 may be generated by a refocusing RF pulse for the on resonance spins. FIG. 7-B illustrates a slice profile 723 generated by an excitation RF pulse for the off resonance spins and a slice profile 722 generated by a refocusing RF pulse for the off resonance spins. Due to gradient magnetic field inhomogeneity and/or a chemical shift, a slice offset (frequency offset) may exist between a slice profile generated for on resonance spins and a slice profile generated for the off resonance spins. For example, compared FIG. 7-A with FIG. 7-B, the slice profile 712 generated by an excitation RF pulse for on resonance spins and the slice profile 723 generated by the same excitation RF pulse for off resonance spins may have a slice offset 724 relative to an axis a (as shown in FIG. 7-A and FIG. 7-B), and the slice profile 711 generated by a refocusing RF pulse and the slice profile 722 generated by the same refocusing RF pulse for off resonance spins may have a slice offset 725 relative to the axis a. The slice offset may be reversely proportionate to the amplitude of the gradient waveform related to an RF pulse. For example, the amplitude of slice-selection gradient waveform related to a refocusing RF pulse may be different with the amplitude of slice-selection gradient waveform related to an excitation RF pulse, and the slice offset 724 may be different from the slice offset 725, and thus an offset difference 727 may be determined. In some embodiments, the amplitude of slice-selection gradient waveform related to a refocusing RF pulse may be same as the amplitude of slice-selection gradient waveform related to an excitation RF pulse, and the slice offset 724 may be the same as the slice offset 725, and thus the offset difference 727 may be zero.

If the refocusing RF pulse is modified according to a VERSE technique, a slice profile 721 may be generated by a refocusing VERSE RF pulse. Because the amplitude of a slice-selection gradient waveform related to the refocusing VERSE RF pulse may be smaller than that of the refocusing RF pulse, a slice offset 726 of the VERSE refocusing RF pulse may be larger than the slice offset 725, and an offset difference 728 between the slice profile generated by the refocusing VERSE RF pulse and the slice profile generated by the excitation RF pulse may be larger than the offset difference 727. Thus, an MR image, generated based on the slice profiles 721 and 723 after the VERSE modification, may have a lower signal noise ratio (SNR) and/or contrast compared with an MRI image generated based on the slice profile 722 and 723 without the VERSE modification. FIG. 11-A is an MR image acquired based on a refocusing RF pulse determined without employing a VERSE technique according to some embodiments of the present disclosure. FIG. 11-B is an MR image acquired based on a refocusing RF pulse that is determined using a VERSE technique according to some embodiments of the present disclosure. The MRI image in FIG. 11-B is darker than the previous MR image in FIG. 11-A. Thus, to implement the VERSE technique, it is desired that the offset difference between a slice profile generated by an excitation RF pulse for the off resonance spins and a slice profile generated by a refocusing RF pulse for the off resonance spins remains the same as before the VERSE modification.

Figure 8:
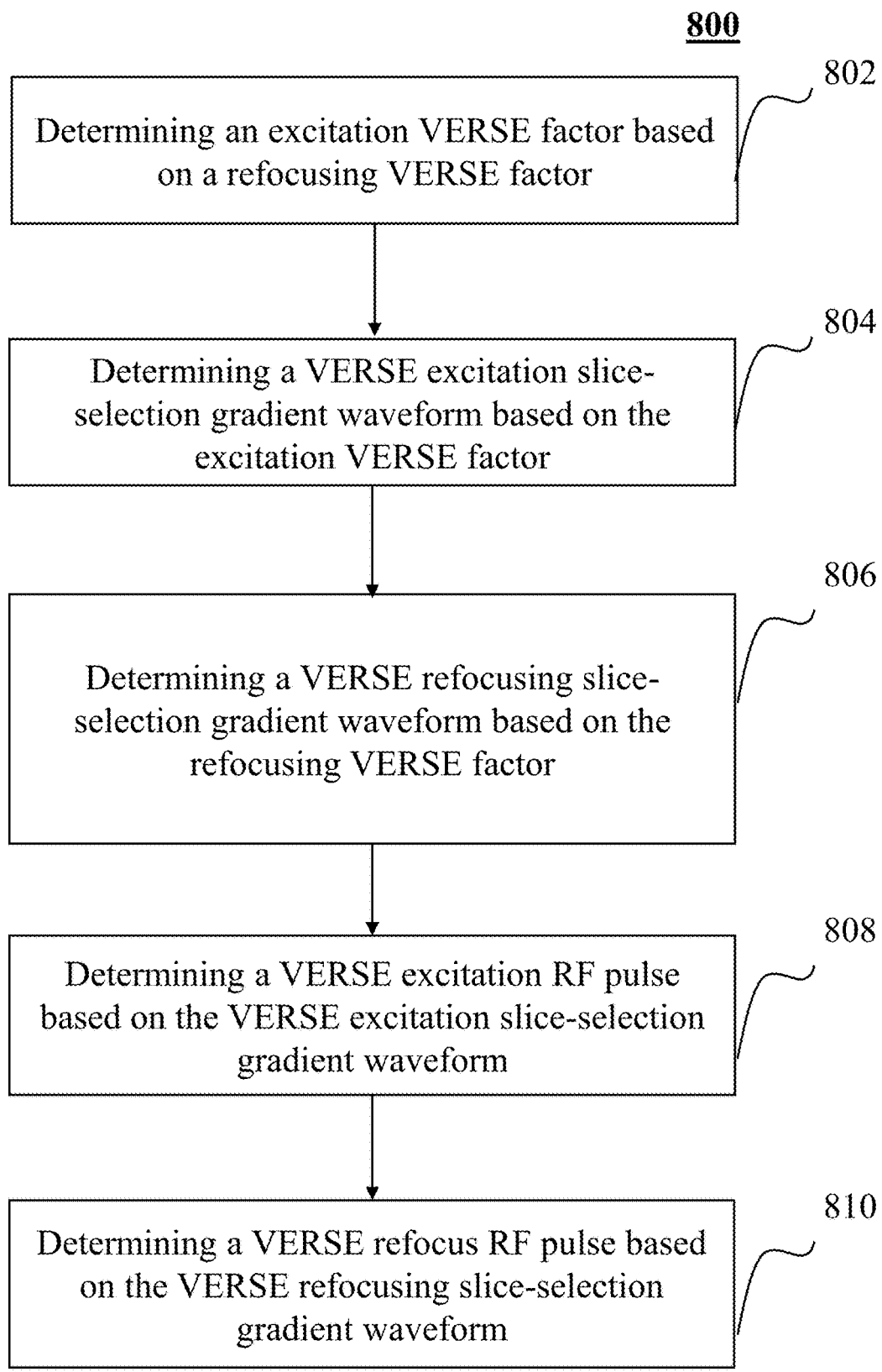
FIG. 8 is a flowchart illustrating an exemplary process for generating an excitation pulse and a refocusing pulse determined based on a VERSE technique according to some embodiments of the present disclosure.

FIG. 8 is a flowchart illustrating an exemplary process 800 for generating an excitation RF pulse and a refocusing RF pulse determined based on a VERSE technique according to some embodiments of the present disclosure. According to process 800, the refocusing RF pulse and the excitation RF pulse may be modified according to a VERSE technique based on a VERSE factor such that before and after the VERSE modification, the offset differences between slice profile generated by the refocusing RF pulse and slice profile generated by the excitation RF pulse remain the same. The VERSE factor may include an excitation VERSE factor (for modifying an excitation slice-selection gradient waveform) and a refocusing VERSE factor (for modifying a refocusing slice-selection gradient waveform). The VERSE factor may reflect a relationship between the amplitude of a slice-selection gradient waveform before the VERSE modification and the amplitude of a slice-selection gradient waveform after the VERSE modification. In some embodiments, taking the amplitude of a slice-selection gradient waveform before the VERSE modification as G1 (e.g., 921 in FIG. 9-B) and the amplitude of some portion of the slice-selection gradient waveform compressed according to the VERSE technique as G2 (e.g., 932 in FIG. 9-B), the VERSE factor $\lambda$ is a value between 1 and 2 that may be expressed as $\lambda = 2 - G2/G1$. That is, the larger the VERSE factor $\lambda$ is, the more the amplitude of a slice-selection gradient waveform is reduced according to the VERSE modification.

In 802, the VERSE modification unit 620 may determine an excitation VERSE factor based on a refocusing VERSE factor. The acquisition module 510 may obtain a refocusing VERSE factor provided by, e.g., a user via an I/O 360; the VERSE modification unit 620 may determine an excitation VERSE factor based on the refocusing VERSE factor and a relationship between the excitation VERSE factor and the refocusing VERSE factor. As another example, the acquisition module 510 may obtain an excitation VERSE factor provided by, e.g., the user via the I/O 360; the VERSE modification unit 620 may determine a refocusing VERSE factor based on the excitation VERSE factor and a relationship between the excitation VERSE factor and the refocusing VERSE factor. In some embodiments, the relationship between the excitation VERSE factor and the refocusing VERSE factor may be expressed in Equation (1) below:

$$\frac{\lambda_{exc} - 1}{\lambda_{refoc} - 1} = \frac{Gss_{exc}}{Gss_{refoc}}. \quad (1)$$

$\lambda_{exc}$ may denote the excitation VERSE factor. $\lambda_{refoc}$ may denote the refocusing VERSE factor. $Gss_{exc}$ may denote the amplitude of the reference excitation slice-selection gradient waveform. $Gss_{refoc}$ may denote the amplitude of the reference refocusing slice-selection gradient waveform. The reference excitation slice-selection gradient waveform may be a pre-designed excitation slice-selection gradient waveform with a constant amplitude gradient. For instance, the pre-designed excitation slice-selection gradient waveform may be generated by the sequence determination module 610. The reference refocusing slice-selection gradient waveform may be a pre-designed refocusing slice-selection gradient waveform with a constant amplitude gradient. For instance, the pre-designed refocusing slice-selection gradient waveform may be generated by the sequence determination module 610.

In 804, the processing module 540 may determine a VERSE excitation slice-selection gradient waveform based on the excitation VERSE factor. The VERSE modification unit 620 of the processing module 540 may modify a reference excitation slice-selection gradient waveform according to an excitation VERSE factor to generate the VERSE excitation slice-selection gradient waveform. The reference excitation slice-selection gradient waveform may be a pre-designed excitation slice-selection gradient waveform with a constant amplitude gradient. For instance, the pre-designed excitation slice-selection gradient waveform may be generated by the sequence determination module 610. The amplitude of the VERSE excitation slice-selection gradient waveform (e.g., VERSE slice-selection gradient waveform 920 shown in FIG. 9-B) may be time-varying. In some embodiments, the operation 804 may be performed according to the relevant portion (e.g., operation 910, etc.) of the process illustrated in FIG. 9-A and the description thereof.

In 806, the processing module 540 may determine a VERSE refocusing slice-selection gradient waveform based on the refocusing VERSE factor. The VERSE modification unit 620 of the processing module 540 may modify a reference refocusing excitation slice-selection gradient waveform according to the refocusing VERSE factor to generate the VERSE refocusing slice-selection gradient waveform. The reference refocusing excitation slice-selection gradient waveform may be a pre-designed refocusing slice-selection gradient waveform with a constant amplitude gradient. For instance, the pre-designed refocusing slice-selection gradient waveform may be generated by the sequence determination module 610. The amplitude of the VERSE refocusing slice-selection gradient waveform (e.g., VERSE slice-selection gradient waveform 920 shown in FIG. 9-B) may be time-varying. In some embodiments, the operation 806 may be performed according to the relevant portion (e.g., operation 910, etc.) of the process illustrated in FIG. 9-A and the description thereof.

In 808, the processing module 540 may determine a VERSE excitation RF pulse based on the VERSE excitation slice-selection gradient waveform. In some embodiments, the sequence determination unit 610 may determine a reference excitation RF pulse. The VERSE modification unit 620 may determine the VERSE excitation RF pulse based on the VERSE excitation slice-selection gradient waveform, the reference excitation slice-selection gradient waveform and the reference excitation RF pulse. In some embodiments, the operation 808 may be performed according to the relevant portion (e.g., operation 1012, etc.) of the process illustrated in FIG. 10 and the description thereof.

In 810, the processing module 540 may determine a VERSE refocusing RF pulse based on the VERSE refocusing slice-selection gradient waveform. In some embodiments, the sequence determination unit 610 may determine a reference refocusing RF pulse. The VERSE modification unit 620 may determine the VERSE refocusing RF pulse based on the VERSE refocusing slice-selection gradient waveform, the reference refocusing slice-selection gradient waveform and the VERSE refocusing RF pulse. In some embodiments, the operation 810 may be performed according to the relevant portion (e.g., operation 1012, etc.) of the process illustrated in FIG. 10 and the description thereof.

In some embodiments, the processing module 540 may cause the MRI scanner 110 to perform a scanning based on the excitation RF pulse determined in operation 808 and the refocusing RF pulse determined in operation 810.

It should be noted that the above description of the process 800 is merely provided for the purpose of illustration, and not intended to limit the scope of the present disclosure. For persons having ordinary skills in the art, multiple variations and modifications may be made to the process 800 under the teachings of the present disclosure. However, those variations and modifications do not depart from the scope of the present disclosure. For example, operation 804 and operation 806 may be integrated into one single operation. For another example, operation 808 may be performed immediately following operation 804, and operation 810 may be performed immediately following operation 806.

FIG. 9-A is a flowchart illustrating an exemplary process 900 for generating a VERSE slice-selection gradient waveform according to some embodiments of the present disclosure. FIG. 9-B is a diagram illustrating exemplary VERSE slice-selection gradient waveforms according to some embodiments of the present disclosure. In FIG. 9-B, the horizontal ordinate represents time and the vertical ordinate represents amplitude.

In 902, the sequence determination unit 610 may determine a reference slice-selection gradient waveform. As exemplified in FIG. 9-B, the reference slice-selection gradient waveform 921 may have the shape of a trapezoid with a constant maximum gradient for transmission with a reference RF pulse. In some embodiments, the reference RF pulse (not shown in the FIG. 9-B) corresponding to the reference gradient waveform 921 may be represented by a sinc curve. As shown in FIG. 9-B, the reference gradient waveform 921 may be designed to have an increasing ramp 922 increasing to a constant amplitude segment 923, then followed by a decreasing ramp 924. The amplitude of the constant amplitude segment 923 may be G0, which may refer to the maximum amplitude of the reference slice-selection gradient waveform. If the segment of the reference slice-selection gradient waveform 921 corresponding to 0 to t1 and the segment of the reference slice-selection gradient waveform 921 corresponding to t6 to t7 is neglected, the reference slice-selection gradient waveform 921 may be approximated to a constant gradient of the segment 923. In some embodiments, the reference gradient waveform 921 may be designed based on the reference RF pulse. The reference RF pulse may be designed based on a desired flip angle, a desired duration, a desired bandwidth, or the like, or any combination thereof.

In 904, the VERSE modification unit 620 may determine a first portion of the VERSE slice-selection gradient waveform based on a first factor and the reference slice-selection gradient waveform. The VERSE modification unit 620 may determine the first factor based on the VERSE factor to increase the amplitude of some portion of the reference slice-selection gradient waveform. The first factor may represent ratio of the amplitude of the first portion of the VERSE slice-selection gradient waveform to the amplitude of some portion of the reference slice-selection gradient waveform (e.g., the segment 923). In some embodiments, the first factor may be equal to the VERSE factor. As shown in FIG. 9-B, the first portion may include segment 931 (from t1 to t2) and segment 933 (from t5 to t6). In some embodiments, the duration of the segment 931 and the duration of the segment 933 may be different. In some embodiments, the duration of the segment 931 and the duration of the segment 933 may be the same, denoted as T1 as illustrated in FIG. 9-B. The amplitude of the first portion of the VERSE slice-selection gradient waveform may be higher than the maximum amplitude of the reference gradient waveform 921 (the portion of 921 that is constant). In some embodiments, the amplitude of the first portion of the slice-selection gradient waveform may be expressed by:

$$G1=\lambda G0, \quad (2)$$

where G1 may denote amplitude of the first portion of the VERSE slice-selection gradient waveform, and $\lambda$ may denote the VERSE factor. If the $\lambda$ is the excitation VERSE factor $\lambda_{exc}$, the reference gradient waveform 921 may be a reference excitation slice-selection gradient waveform and designed for an excitation RF pulse and the VERSE slice-selection gradient waveform generated based on the process 900 may be designed for a VERSE excitation RF pulse. If the $\lambda$ is the refocusing VERSE factor $\lambda_{refoc}$, the reference gradient waveform 921 may be a reference refocusing slice-selection gradient waveform and designed for a refocusing RF pulse and the VERSE slice-selection gradient waveform generated based on the process 900 may be designed for a VERSE refocusing RF pulse.

In 906, the VERSE modification unit 620 may determine a second portion of the VERSE slice-selection gradient waveform based on a second factor and the reference waveform. The VERSE modification unit 620 may determine the second factor based on the VERSE factor to reduce the amplitude of some portion of the reference slice-selection gradient waveform. The second factor may represent ratio of the amplitude of the second portion of the VERSE slice-selection gradient waveform to the amplitude of some portion of the reference slice-selection gradient waveform (e.g., the segment 923). In some embodiments, the second factor may be equal to difference between 2 and the VERSE factor. As shown in FIG. 9-B, the second portion may include segment 932 (from t3 to t4). In some embodiments, the duration of the second portion (e.g., from t3 to t4) may be equal to the duration of the first portion (e.g., the sum of the duration from t1 to t2 and the duration from t5 to t6). In some embodiment, duration of the segment 932 T2 may be expressed in T2=2T1. The amplitude of the second portion of the slice-selection gradient waveform may be lower than the maximum amplitude of the reference slice-selection gradient waveform 921 (the portion of 921 that is constant). In some embodiments, the sum of the first factor and the second factor may be a constant value (e.g., 2). In some embodiments, the amplitude of the second portion of the slice-selection gradient waveform may be expressed by:

$$G2=(2-\lambda)G0, \quad (3)$$

where G2 may denote the amplitude of the first portion of the VERSE slice-selection gradient waveform, and $\lambda$ may denote the VERSE factor. If the $\lambda$ is the excitation VERSE factor $\lambda_{exc}$, the reference gradient waveform 921 may be a reference excitation slice-selection gradient waveform and designed for an excitation RF pulse and the VERSE slice-selection gradient waveform generated based on the process 900 may be designed for a VERSE excitation RF pulse. If the $\lambda$ is the refocusing VERSE factor $\lambda_{refoc}$, the reference gradient waveform 921 may be a reference refocusing slice-selection gradient waveform and designed for a refocusing RF pulse and the VERSE slice-selection gradient waveform generated based on the process 900 may be designed for a VERSE refocusing RF pulse.

In 908, a third portion of the slice-selection gradient waveform may be generated based on the ramp between the first portion and the second portion by the VERSE modification unit 620. As shown in FIG. 9-B, the third portion of the slice-selection gradient waveform may refer to the ramps 934 (from t2 to t3) and 935 (from t4 to t5) which are between the first portion and the second portion of the VERSE slice-selection gradient waveform. In some embodiments, the ramps 933 and 934 may be a linear shape or sinusoidal shape. Duration of the ramps 933 and 934 in total may be very short (e.g., from 10 nanoseconds to 10 microseconds).

In 910, the VERSE slice-selection gradient waveform may be determined based on the first portion, the second portion and the third portion of the slice-selection gradient waveform by the VERSE modification unit 620. The VERSE modification unit 620 may determine a VERSE slice-selection gradient waveform 920 based on the segment 931, segment 932, segment 933, ramp 934, and ramp 935 to determine a VERSE slice-selection gradient waveform. The VERSE slice-selection gradient waveform may be a VERSE excitation slice-selection gradient waveform or a VERSE refocusing slice-selection gradient waveform.

It should be noted that the above description of the process 900 is merely provided for the purpose of illustration, and not intended to limit the scope of the present disclosure. For persons having ordinary skills in the art, multiple variations and modifications may be made to the process 900 under the teachings of the present disclosure. However, those variations and modifications do not depart from the scope of the present disclosure. For example, operation 904 and operation 906 may be integrated into one single operation.

FIG. 10-A is a flowchart illustrating an exemplary process 1000 for generating the VERSE RF pulse according to some embodiments of the present disclosure. FIG. 10-B is a diagram illustrating an exemplary VERSE RF pulse according to some embodiments of the present disclosure. FIG. 10-C is a diagram illustrating an exemplary reference RF pulse according to some embodiments of the present disclosure. In FIGS. 10-B and 10-C, the horizontal ordinate represents time and the vertical ordinate represents amplitude. As shown in FIG. 10-C, the reference RF pulse 1024 may have a first side lobe 1025, a main lobe 1026, and a second side lobe 1027; the reference slice-selection gradient waveform 1023 related to the reference RF pulse 1024 may have the shape of a trapezoid with a constant maximum gradient. According to the VERSE technique, the main lobe 1026 may need to be lengthened or stretched to generate a VERSE RF pulse 1021. To maintain a net desired flip angle, the center portion the reference slice-selection gradient waveform 1023 may need to be reduced to generate the VERSE slice-selection gradient waveform 1022.

As shown in FIG. 10-B, the VERSE RF pulse obtained by the exemplary process 1000 may be expressed using function A1(t) extending from time $ta_0$ to time $ta_n$. The time range from time $ta_0$ to time $ta_n$ may include one or more first time points $ta_1$ (e.g., $ta_0$, $ta_1$, $ta_2$, $ta_3$, . . . $ta_n$). In some embodiments, the interval between each pair of neighboring first time points may be the same. By determining the amplitude of A1(t) at each first time point, function A1(t) may be determined.

In 1002, the sequence determination unit 610 may determine a reference RF pulse 1024 and a reference slice-selection gradient waveform 1023. The reference RF pulse may be designed based on a desired flip angle, a desired duration, a desired bandwidth, or the like, or any combination thereof. The reference RF pulse 1024 may be expressed using function A0(t) and the reference slice-selection gradient waveform 1023 may be expressed using function G0(t), as shown in FIG. 10-C.

In 1004, a VERSE slice-selection gradient waveform 1022 may be determined based on the reference slice-selection gradient waveform 1023 by the VERSE modification unit 620. The operation 1004 may be performed according to the relevant portion (e.g., operation 910, etc.) of the process illustrated in FIG. 9-A and the description thereof. The VERSE slice-selection gradient waveform 1022 may be expressed using function G1(t), as shown in FIG. 10-B.

In 1006, a first integral of a first time point related to the VERSE slice-selection gradient waveform may be determined by the VERSE modification unit 620. The first integral of a first time point may be the area under the VERSE slice-selection gradient waveform from time $ta_0$ to another first time point. For example, the first integral of $ta_1$ may be the area under the slice-selection gradient waveform from $t_0$ to $ta_1$.

In 1008, a second time point related to the reference slice-selection gradient waveform may be determined based on the first integral by the VERSE modification unit 620. As shown in FIG. 10-C, the reference RF pulse 1024 may be expressed using function A0(t) extending from time $tb_0$ to time $tb_n$. The time range from time $tb_0$ to time $tb_n$ may include one or more second time points (e.g., $tb_1$). A second integral may be the area under the reference slice-selection gradient waveform 1023 G0(t) from time $tb_0$ to a second time point. The VERSE modification unit 620 may determine a second time point on the reference RF pulse 1024, and the second integral related to the reference RF pulse A0(t) and the second time point $tb_1$ may be equal to the first integral of the first time points $ta_1$ related to the VERSE slice-selection gradient waveform. For example, the VERSE modification unit 620 may determine a second time point $tb_1$ on the reference slice-selection gradient waveform 1023, and the second integral of $tb_1$ may be equal to the first integral of $ta_1$.

In 1010, a first amplitude of the VERSE RF pulse corresponding to a first time point may be determined based on the corresponding second time point. Merely by way of example, the VERSE modification unit 620 may determine the amplitude of the VERSE slice-selection gradient waveform 1022 at the first time point $ta_i$, the amplitude of the reference slice-selection gradient waveform 1023 at the second time point $tb_i$, the amplitude of the reference RF pulse 1023 at the second time point $tb_i$, and determine the amplitude of the VERSE RF pulse 1022 at the first time point $ta_i$ with equation expressed as below:

$$\frac{G1(tai)}{G0(tbi)} = \frac{A1(tai)}{A0(tbi)}. \tag{4}$$

In 1012, a VERSE RF pulse may be generated based on the first amplitude. The VERSE modification unit 620 may determine the amplitude of A1(t) at each first time point, then function A1(t) may be determined.

It should be noted that the above description of the process 1000 is merely provided for the purpose of illustration, and not intended to limit the scope of the present disclosure. For persons having ordinary skills in the art, multiple variations and modifications may be made to the process 1000 under the teachings of the present disclosure. However, those variations and modifications do not depart from the scope of the present disclosure.

EXAMPLES

FIG. 12-A is an MR image acquired based on reference RF pulse and reference slice-selection gradient waveform. FIG. 12-B is an MR image acquired based on a VERSE RF pulse generated from the reference RF pulse illustrated in FIG. 12-A and a VERSE slice-selection gradient waveform generated from the reference slice-selection gradient waveform illustrated in FIG. 12-A according to some embodiments of present disclosure. SNR and contrast of MR image in FIG. 12-B may be almost the same as that of MR image in FIG. 12-A, but the overall RF transmit power generated by the VERSE RF pulse in FIG. 12-B is much lower than the overall RF transmit power generated by reference RF pulse in FIG. 12-A.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by this disclosure, and are within the spirit and scope of the exemplary embodiments of this disclosure.

Moreover, certain terminology has been used to describe embodiments of the present disclosure. For example, the terms "one embodiment," "an embodiment," and/or "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the present disclosure.

Further, it will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely hardware, entirely software (including firmware, resident software, micro-code, etc.) or combining software and hardware implementation that may all generally be referred to herein as a "unit," "module," or "system." Furthermore, aspects of the present disclosure may take the form of a computer program product embodied in one or more computer readable media having computer readable program code embodied thereon.

A computer readable signal medium may include a propagated data signal with computer readable program code embodied therein, for example, in baseband or as part of a carrier wave. Such a propagated signal may take any of a variety of forms, including electro-magnetic, optical, or the like, or any suitable combination thereof. A computer readable signal medium may be any computer readable medium that is not a computer readable storage medium and that may communicate, propagate, or transport a program for use by or in connection with an instruction execution system, apparatus, or device. Program code embodied on a computer readable signal medium may be transmitted using any appropriate medium, including wireless, wireline, optical fiber cable, RF, or the like, or any suitable combination of the foregoing.

Computer program code for carrying out operations for aspects of the present disclosure may be written in any combination of one or more programming languages, including an object oriented programming language such as Java, Scala, Smalltalk, Eiffel, JADE, Emerald, C++, C#, VB. NET, Python or the like, conventional procedural programming languages, such as the "C" programming language, Visual Basic, Fortran 2103, Perl, COBOL 2102, PHP, ABAP, dynamic programming languages such as Python, Ruby and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Furthermore, the recited order of processing elements or sequences, or the use of numbers, letters, or other designations therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose, and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software only solution, for example, an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various inventive embodiments. This method of disclosure, however, is not to be interpreted as reflecting an intention that the claimed subject matter requires more features than are expressly recited in each claim. Rather, inventive embodiments lie in less than all features of a single foregoing disclosed embodiment.

In some embodiments, the numbers expressing quantities or properties used to describe and claim certain embodiments of the application are to be understood as being modified in some instances by the term "about," "approximate," or "substantially." For example, "about," "approximate," or "substantially" may indicate ±20% variation of the value it describes, unless otherwise stated. Accordingly, in some embodiments, the numerical parameters set forth in the written description and attached claims are approximations that may vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the application are approximations, the numerical values set forth in the specific examples are reported as precisely as practicable.

Each of the patents, patent applications, publications of patent applications, and other material, such as articles, books, specifications, publications, documents, things, and/or the like, referenced herein is hereby incorporated herein by this reference in its entirety for all purposes, excepting any prosecution file history associated with same, any of same that is inconsistent with or in conflict with the present document, or any of same that may have a limiting affect as to the broadest scope of the claims now or later associated with the present document. By way of example, should there be any inconsistency or conflict between the description, definition, and/or the use of a term associated with any of the incorporated material and that associated with the present document, the description, definition, and/or the use of the term in the present document shall prevail.

In closing, it is to be understood that the embodiments of the application disclosed herein are illustrative of the principles of the embodiments of the application. Other modifications that may be employed may be within the scope of the application. Thus, by way of example, but not of limitation, alternative configurations of the embodiments of the application may be utilized in accordance with the teachings herein. Accordingly, embodiments of the present application are not limited to that precisely as shown and describe.

We claim:

1. A method, implemented on a computing device having at least one processor and storage, for magnetic resonance imaging (MRI), the method comprising:
   obtaining an excitation variable-rate selective excitation (VERSE) factor and a refocusing VERSE factor;

generating a first slice-selection gradient waveform based on the excitation VERSE factor and a reference excitation slice-selection gradient waveform;

generating a second slice-selection gradient waveform based on the refocusing VERSE factor and a reference refocusing slice-selection gradient waveform, wherein an amplitude of the first slice-selection gradient waveform and an amplitude of the second slice-selection gradient waveform are time-varying:

generating an excitation pulse based on the first slice-selection gradient waveform;

generating a refocusing pulse based on the second slice-selection gradient waveform, wherein a ratio between the decimal part of the excitation VERSE factor and the decimal part of the refocusing VERSE factor equals to a ratio of the amplitude of the reference excitation slice-selection gradient waveform to the amplitude of the reference refocusing slice-selection gradient waveform.

2. The method of claim 1, wherein the excitation VERSE factor or the refocusing VERSE factor is equal to or greater than 1 and less than 2.

3. The method of claim 1, wherein offset difference between a slice profile generated by the excitation RF pulse for off resonance spins and a slice profile generated by the refocusing RE pulse for the off resonance spins remains the same.

4. The method of claim 1, the slice-selection gradient waveform generation further comprising:

determining a reference gradient waveform, wherein the reference gradient waveform is the reference excitation slice-selection gradient waveform or the reference refocusing slice-selection gradient waveform;

determining a first portion of the slice-selection gradient waveform based on a first factor and the reference gradient waveform;

determining a second portion of the slice-selection gradient waveform based on a second factor and the reference gradient waveform;

determining a third portion of the slice-selection gradient waveform based on a ramp between the first portion and the second portion; and generating the slice-selection gradient waveform based on the first portion, the second portion and the third portion of the slice-selection gradient waveform.

5. The method of claim 4, wherein the first factor relates to the excitation VERSE factor or the refocusing VERSE factor.

6. The method of claim 5, wherein the first factor is the excitation VERSE factor or the refocusing VERSE factor.

7. The method of claim 4, wherein the second factor relates to the excitation VERSE factor or the refocusing VERSE factor.

8. The method of claim 4, wherein a sum of the first factor and the second factor is a constant.

9. The method of claim 4, wherein the duration of the first portion of the slice-selection gradient waveform equals the duration of the second portion of the slice-selection gradient waveform.

10. The method of claim 4, wherein the first portion of the slice-selection gradient waveform includes a first segment and a second segment.

11. The method of claim 10, wherein the duration of the first segment equals the duration of the second segment.

12. The method of claim 4, wherein the third portion of the slice-selection gradient waveform is a linear function or a sine function.

13. The method of claim 4, generating the excitation pulse or the refocusing pulse further comprising:

determining a reference pulse;

determining a first integral related to the slice-selection gradient waveform corresponding to a first time point;

determining a second time point of the reference gradient waveform based on the first integral, wherein a second integral related to the reference gradient waveform corresponding to the second time point is equal to the first integral;

determining a second amplitude of the reference pulse corresponding to the second time point;

determining a first amplitude of an RF pulse corresponding to the first time point based on the second amplitude; and determining the RF pulse based on the first amplitude, wherein the RF pulse is the excitation pulse or the refocusing pulse.

14. The method of claim 13, wherein a ratio of the second amplitude of the reference pulse corresponding to the second time point to the first amplitude of the RF pulse corresponding to the first time point is equal to a ratio of the amplitude of the reference gradient waveform at the second time point to the amplitude of the slice-selection gradient waveform at the first time point.

15. The method of claim 1, wherein the obtaining an excitation VERSE factor and a refocusing VERSE factor includes: receiving the refocusing VERSE factor from a user.

16. The method of claim 1, wherein the method further includes:

causing an MRI scanner to perform a scanning based on the determined excitation pulse and the determined refocusing pulse.

17. A method, implemented on a computing device having at least one processor and storage, for magnetic resonance imaging, the method comprising:

obtaining an excitation variable-rate selective excitation (VERSE) factor and a refocusing VERSE factor;

determining a first slice-selection gradient waveform based on the excitation VERSE factor and a reference excitation slice-selection gradient waveform;

determining a second slice-selection gradient waveform based on the refocusing VERSE factor and a reference refocusing slice-selection gradient waveform;

determining a VERSE excitation pulse based on the first slice-selection gradient waveform and a reference excitation pulse;

determining a VERSE refocusing pulse based on the second slice-selection gradient waveform and a reference refocusing pulse, wherein an offset difference between a slice profile of the reference excitation pulse and a slice profile of the reference refocusing pulse is substantially the same as an offset difference between a slice profile of the VERSE excitation pulse and a slice profile of the VERSE refocusing pulse.

18. A magnetic resonance imaging (MRI) system, comprising:

a computer-readable storage medium storing a first set of instructions for magnetic resonance imaging;

at least one processor in communication with the computer-readable storage medium, wherein when executing the first set of instructions, the at least one processor is directed to:

obtain an excitation variable-rate selective excitation (VERSE) factor and a refocus VERSE factor;

generate a first slice-selection gradient waveform based on an excitation factor;
generate a second slice-selection gradient waveform based on a refocusing factor, wherein an amplitude of the first slice-selection gradient waveform and amplitude of the second slice-selection gradient waveform are time-varying;
generate an excitation pulse based on the first slice-selection gradient waveform;
generate a refocusing pulse based on the second slice-selection gradient waveform,
wherein a ratio between the decimal part of the excitation factor and the decimal part of the refocusing factor equals to a ratio of the amplitude of the first reference gradient waveform to the amplitude of the second reference gradient waveform.

19. The MRI system of claim 18, to generate a slice-selection gradient waveform, the processor is further directed to:
determine a reference gradient waveform;
determine a first portion of the slice-selection gradient waveform based on a first factor and the reference gradient waveform;
determine a second portion of the slice-selection gradient waveform based on a second factor and the reference gradient waveform;
determine a third portion of the slice-selection gradient waveform based on a ramp between the first portion and the second portion; and
determine the slice-selection gradient waveform based on the first portion, the second portion and the third portion of the slice-selection gradient waveform,
wherein the first factor is the excitation VERSE factor or the refocusing VERSE factor, and the second factor relates to the excitation VERSE factor or the refocusing VERSE factor and wherein a sum of the first factor and the second factor is a constant.

20. The MRI system of claim 19, wherein to generate the excitation pulse or the refocusing pulse, the processor is further directed to:
determine a reference pulse;
determine a first integral related the slice-selection gradient waveform corresponding to a first time point;
determine a second time point based on the first integral; wherein a second integral related to the reference gradient waveform corresponding to the second time point is equal to the first integral;
determine a second amplitude of the reference pulse corresponding to the second time point;
determine, a first amplitude of an RF pulse corresponding to the first time point based on the second amplitude; and
determine the RF pulse based on the first amplitude, wherein the RF pulse is the excitation pulse or the refocusing pulse.

* * * * *